US009887378B2

(12) United States Patent
Chang

(10) Patent No.: US 9,887,378 B2
(45) Date of Patent: Feb. 6, 2018

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Seung-Wook Chang, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 94 days.

(21) Appl. No.: 13/933,079

(22) Filed: Jul. 1, 2013

(65) Prior Publication Data
US 2014/0048781 A1 Feb. 20, 2014

(30) Foreign Application Priority Data

Aug. 17, 2012 (KR) .................. 10-2012-0090096

(51) Int. Cl.
*H01L 51/50* (2006.01)
*H01L 51/56* (2006.01)
(Continued)

(52) U.S. Cl.
CPC .......... *H01L 51/504* (2013.01); *C23C 14/042* (2013.01); *C23C 14/12* (2013.01);
(Continued)

(58) Field of Classification Search
CPC ... H01L 25/0753; H01L 25/075; H01L 51/50; H01L 51/5016; H01L 51/504;
(Continued)

(56) References Cited

U.S. PATENT DOCUMENTS 6,541,130 B2 4/2003 Fukuda
7,545,096 B2 6/2009 Lee et al.
(Continued)

FOREIGN PATENT DOCUMENTS

JP 2000-323277 11/2000
JP 2002-175878 6/2002
(Continued)

OTHER PUBLICATIONS

Shih-Liang Ku, Cheng-Chung Lee, Optical and structural properties of silicon nitride thin films prepared by ion-assisted deposition, Optical Materials, vol. 32, Issue 9, Jul. 2010, pp. 956-960, ISSN 0925-3467, http://dx.doi.org/10.1016/j.optmat.2010.01.032. (http://www.sciencedirect.com/science/article/pii/S0925346710000406).*

(Continued)

*Primary Examiner* — Lauren R Bell
(74) *Attorney, Agent, or Firm* — Lewis Roca Rothgerber Christie LLP

(57) ABSTRACT

An organic light-emitting display apparatus includes a substrate comprising pixels, each of which comprises a first sub-pixel, a second sub-pixel, and a third sub-pixel, and a plurality of pixel electrodes independently formed for respective sub-pixels; a first common layer commonly formed on the pixels; first lines covering first sub-pixels arranged in a first direction, wherein the first lines comprise a first organic light-emitting layer; a plurality of second lines covering second sub-pixels arranged in the first direction, wherein the second lines comprise a second organic light-emitting layer differing from the first organic light-emitting layer; a second common layer commonly formed on the plurality of pixels, wherein the second common layer comprises a third organic light-emitting layer differing from the first organic light-emitting layer and the second organic light-emitting layer; a third common layer commonly (Continued)

formed on the pixels; and an opposite electrode commonly formed on the pixels.

16 Claims, 15 Drawing Sheets

(51) Int. Cl.
    *H01L 27/32*     (2006.01)
    *C23C 14/04*     (2006.01)
    *C23C 14/12*     (2006.01)
    *C23C 14/24*     (2006.01)
    *C23C 14/56*     (2006.01)
    *H01L 51/52*     (2006.01)

(52) U.S. Cl.
    CPC .............. *C23C 14/24* (2013.01); *C23C 14/56* (2013.01); *H01L 27/3211* (2013.01); *H01L 51/5064* (2013.01); *H01L 51/56* (2013.01); H01L 27/3248 (2013.01); H01L 51/5265 (2013.01); H01L 51/5275 (2013.01); H01L 2227/323 (2013.01)

(58) Field of Classification Search
    CPC . H01L 51/56; H01L 51/5275; H01L 51/5265; H01L 51/5203; H01L 27/3211; H01L 27/3248; H01L 2227/323; C23C 14/56; C23C 14/12; C23C 14/042; C23C 14/24
    See application file for complete search history.

(56) References Cited

U.S. PATENT DOCUMENTS

| | | | |
|---|---|---|---|
| 7,696,524 B2 * | 4/2010 | Ikeda et al. ................ | 257/98 |
| 7,872,256 B2 | 1/2011 | Sung et al. | |
| 2002/0076847 A1 | 6/2002 | Yamada et al. | |
| 2005/0186330 A1 | 8/2005 | Kim et al. | |
| 2006/0017377 A1* | 1/2006 | Ryu ................... | H01L 51/5265 |
| | | | 313/504 |
| 2008/0115729 A1 | 5/2008 | Oda et al. | |
| 2008/0136322 A1* | 6/2008 | Kurotaki ............. | H01L 51/5016 |
| | | | 313/504 |
| 2010/0133994 A1* | 6/2010 | Song et al. ................... | 313/504 |
| 2011/0133634 A1* | 6/2011 | Jeong et al. .................. | 313/504 |
| 2011/0133636 A1* | 6/2011 | Matsuo ............... | H01L 27/3211 |
| | | | 313/504 |
| 2011/0180825 A1* | 7/2011 | Lee et al. ........................ | 257/89 |
| 2013/0001528 A1 | 1/2013 | Chang et al. | |
| 2013/0001578 A1* | 1/2013 | Song ................... | H01L 27/1255 |
| | | | 257/71 |

FOREIGN PATENT DOCUMENTS

| | | |
|---|---|---|
| JP | 2003-157973 | 5/2003 |
| JP | 2003-297562 | 10/2003 |
| KR | 10-2005-0082644 | 8/2005 |
| KR | 10-0823511 | 4/2008 |
| KR | 10-2013-0007308 | 1/2013 |
| TW | 200714133 | 4/2007 |

OTHER PUBLICATIONS

Tan et al. Optical properties of amorphous silicon nitride thin-films prepared by VHF-PECVD using silane and nitrogen. Journal of Materials Science: Materials in Electronics. Jan. 2009, vol. 20, Issue 1 Supplement, pp. 15-18.*

B. Liao and C. Hsiao, "Improving optical properties of silicon nitride films to be applied in the middle infrared optics by a combined high-power impulse/unbalanced magnetron sputtering deposition technique," Appl. Opt. 53, A377-A382 (2014).*

Crystan: Magnesium Oxide, http://www.crystran.co.uk/optical-materials/magnesium-oxide-mgo, accessed Feb. 4, 2015.*

Crystran: Magnesium Fluoride, http://www.crystran.co.uk/optical-materials/magnesium-fluoride-mgf2, accessed Feb. 4, 2015.*

Patent Abstracts of Japan, and English machine translation of Japanese Publication 2003-297562 dated Oct. 17, 2003, listed above, (21 pages).

* cited by examiner

ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2012-0090096, filed on Aug. 17, 2012, in the Korean Intellectual Property Office, the disclosure of which is incorporated herein in its entirety by reference.

BACKGROUND

1. Field of the Invention

The following description relates to an organic light-emitting display apparatus and a method of manufacturing the same.

2. Description of the Related Art

An organic light-emitting display device includes intermediate layers (including an emission layer) disposed between electrodes that are arranged opposite to (arranged to face) each other. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are to be formed, and an organic layer material is deposited on the FMM to form the organic layer having a desired pattern.

However, the deposition method using such an FMM presents difficulties in manufacturing large organic light-emitting display devices using a large mother glass. For example, when a large mask is used, the mask may bend due to a gravitational pull to thereby distort its pattern. Such disadvantages are not conducive to the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was already known by the inventors of the present invention before achieving the present invention or is technical information acquired in the process of achieving the present invention. Therefore, it may contain information that does not form the prior art that is already known in this country to a person of ordinary skill in the art.

SUMMARY

Aspects of embodiments of the present invention are directed toward an organic light-emitting display apparatus having increased luminescent efficiency, lifetime, and productivity, and a method of manufacturing the organic light-emitting display apparatus.

According to an embodiment of the present invention, there is provided an organic light-emitting display apparatus. The organic light-emitting display apparatus includes a substrate including a plurality of pixels each of which includes a first sub-pixel, a second sub-pixel, and a third sub-pixel, and a plurality of pixel electrodes that are independently formed for respective sub-pixels; a first common layer that is commonly formed on the plurality of pixels; a plurality of first lines that are formed to cover first sub-pixels that are arranged in a first direction, wherein the plurality of first lines include a first organic light-emitting layer; a plurality of second lines that are formed to cover second sub-pixels that are arranged in the first direction, wherein the plurality of second lines include a second organic light-emitting layer that is different from the first organic light-emitting layer; a second common layer that is commonly formed on the plurality of pixels, wherein the second common layer includes a third organic light-emitting layer that is different from the first organic light-emitting layer and the second organic light-emitting layer; a third common layer that is commonly formed on the plurality of pixels; and an opposite electrode that is commonly formed on the plurality of pixels.

The first common layer may include a hole injection transport material.

The third common layer may include an electron transport material.

The organic light-emitting display apparatus may further include a plurality of third lines that are formed to cover two lines of sub pixels that are adjacent to each other, from among the first sub-pixels, the second sub-pixels, and the third sub-pixels, which are arranged in the first direction.

The third lines may include a hole injection transport material.

The organic light-emitting display apparatus may further include a plurality of fourth lines that are formed to cover any one line of sub-pixels from among the first sub-pixels, the second sub-pixels, and the third sub-pixels, which are arranged in the first direction.

The fourth lines may include a hole injection transport material.

The plurality of pixel electrodes may include light-transmitting conductive oxide having a greater refractive index than the substrate, the organic light-emitting display apparatus further including: a refraction conversion layer disposed between the substrate and the pixel electrodes, the refraction conversion layer including a first layer having a greater refractive index than that of the pixel electrodes, a second layer having a smaller refractive index than that of the first layer, and a third layer having a smaller refractive index than that of the second layer, wherein the first layer, the second layer, and the third layer are sequentially stacked from the pixel electrodes toward the substrate.

A thickness of the first layer may be smaller than a thickness of the second layer, and wherein the thickness of the second layer may be smaller than a thickness of the third layer.

Light transmittance of the first layer may be smaller than that of the second layer, and wherein light transmittance of the second layer may be smaller than that of the third layer.

The refractive index of the pixel electrodes may be greater than a refractive index of at least one of the first common layer, the first lines, the second lines, the second common layer, and the third common layer.

The organic light-emitting display apparatus may further include a semi-transparent reflective layer disposed between the pixel electrodes and the refraction conversion layer.

According to another embodiment of the present invention there is provided a method of manufacturing an organic light-emitting display apparatus. The method includes preparing a substrate including a plurality of pixels that each include a first sub-pixel, a second sub-pixel, and a third sub-pixel, and a plurality of pixel electrodes that are independently formed for respective sub-pixels; when a first common-type deposition assembly and the substrate are spaced apart from each other and are moved relative to each other, commonly forming a first common layer on the plurality of pixels; when a first linear-layer deposition assembly and the substrate are spaced apart from each other and are moved relative to each other, forming a plurality of first lines including a first organic light-emitting layer so as to cover first sub-pixels that are arranged in a direction in which the first linear-layer deposition assembly and the substrate are moved; when a second linear-layer deposition assembly and the substrate are spaced apart from each other and are moved relative to each other, forming a plurality of second lines including a second organic light-emitting layer that is different from the first organic light-emitting layer so as to cover second sub-pixels that are arranged in a direction in which the second linear-layer deposition assembly and the substrate are moved; when a second common-type deposition assembly and the substrate are spaced apart from each other and are moved relative to each other, commonly forming a second common layer including a third organic light-emitting layer that is different from the first and second organic light-emitting layers; when a third common-type deposition assembly and the substrate are spaced apart from each other and are moved relative to each other, commonly forming a third common layer on the plurality of pixels; and commonly forming an opposite electrode on the plurality of pixels.

The first common layer may include a hole injection transport material.

The third common layer may include an electron transport material.

The method may further include, when a third linear-layer deposition assembly and the substrate are spaced apart from each other and are moved relative to each other, forming a plurality of third lines on the substrate so as to two lines of sub-pixels that are adjacent to each other, from among the first sub-pixels, the second sub-pixels, and the third sub-pixels, which are arranged in a direction in which the third linear-layer deposition assembly and the substrate are moved.

The third lines may include a hole injection transport material.

The method may further include, when a fourth linear-layer deposition assembly and the substrate are spaced apart from each other and are moved relative to each other, forming a plurality of fourth lines on the substrate so as to any one line of sub-pixels from among the first sub-pixels, the second sub-pixels, and the third sub-pixels, which are arranged in a direction in which the fourth linear-layer deposition assembly and the substrate are moved.

The fourth lines may include a hole injection transport material.

Since an organic light-emitting layer may be patterned via continuous deposition processes, a processing speed may be remarkably increased and excellent deposition quality may be maintained.

A tack time and process efficiency may be increased by reducing the number of masks.

Luminescent efficiency for each respective color may be optimized.

Total reflection may be prevented on an interface between a pixel electrode and a substrate so as to prevent a reduction in luminescent efficiency.

In addition, a difference in color conversion due to a change in view angle, which is caused by a change in refractive index, may be reduced.

Since a refraction conversion layer functions as a gate insulating layer of a transistor and/or a dielectric layer of a capacitor, device properties of the transistor and the capacitor may be improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
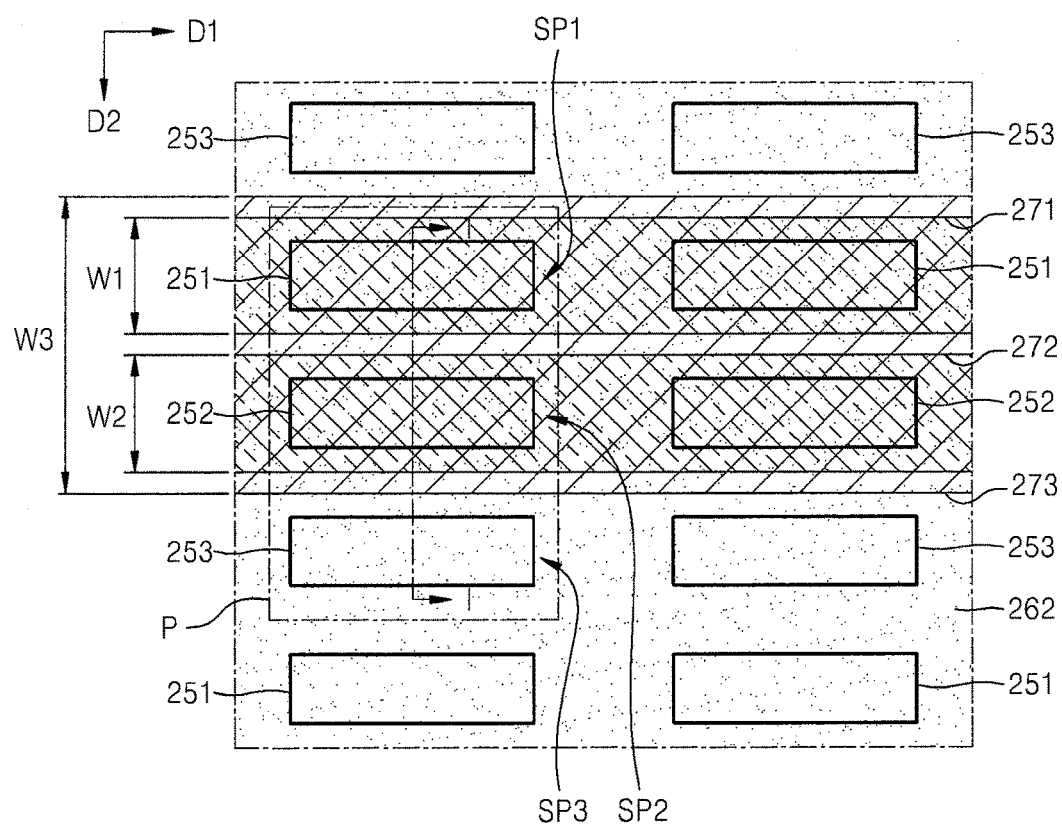
FIG. 1 is a plan view of a portion of an organic light-emitting display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures. As used herein, the term "and/or" includes any and all combinations of one or more of the associated listed items. Expressions such as "at least one of," when preceding a list of elements, modify the entire list of elements and do not modify the individual elements of the list.

Figure 2:
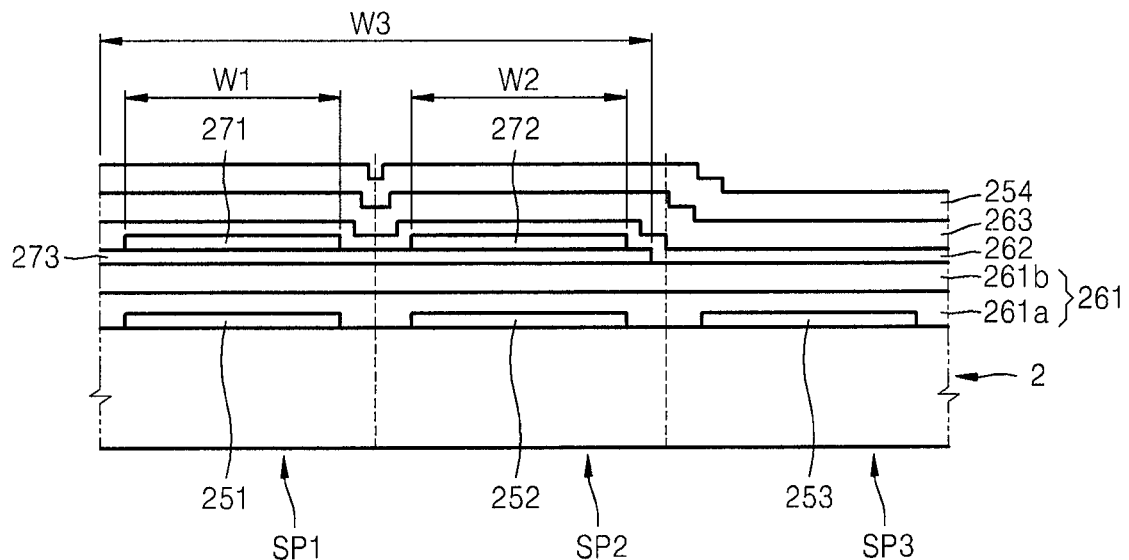
FIG. 2 is a cross-sectional view of the organic light-emitting display apparatus taken along line I-I of FIG. 1, according to an embodiment of the present invention.

FIG. 1 is a plan view of a portion of an organic light-emitting display apparatus according to an embodiment of the present invention. FIG. 2 is a cross-sectional view of the organic light-emitting display apparatus taken along line I-I of FIG. 1, according to an embodiment of the present invention. For convenience of description, FIG. 1 only shows first pixel electrodes 251, second pixel electrodes 252, and third pixel electrodes 253, a second common layer 262, first lines 271, second lines 272, and third lines 273 from among elements shown in FIG. 2.

Referring to FIGS. 1 and 2, the organic light-emitting display apparatus is formed on a substrate 2.

The substrate 2 may include a plurality of pixels P, each of which may include a plurality of sub-pixels for emitting light rays of different colors. Referring to FIGS. 1 and 2, each pixel P includes a first sub-pixel SP1, a second sub-pixel SP2, and a third sub-pixel SP3 that are arranged adjacent to each other in a second direction D2. The first sub-pixel SP1, the second sub-pixel SP2, and the third sub-pixel SP3 may be sub-pixels that emit red light, green light, and blue light, respectively. However, the present invention is not limited thereto. Color light rays emitted from the first sub-pixel SP1, the second sub-pixel SP2, and the third sub-pixel SP3 may be combined with each other to realize white light. Alternatively, each pixel may include a plurality of sub-pixels for realizing white light, as well as the three sub-pixels described above.

A first pixel electrode 251 is disposed in a first sub-pixel SP1. A second pixel electrode 252 is disposed in a second sub-pixel SP2. A third pixel electrode 253 is disposed in a third sub-pixel SP3. The first pixel electrode 251, the second pixel electrode 252, and the third pixel electrode 253 may have different island forms.

As shown in FIG. 1, the first pixel electrodes 251 may be arranged adjacent to each other in a first direction D1 perpendicular to (or crossing) the second direction D2. As shown in FIG. 1, the second pixel electrodes 252 may be arranged adjacent to each other in the first direction D1. As shown in FIG. 1, the third pixel electrodes 253 may be arranged adjacent to each other in the first direction D1. The first pixel electrodes 251, the second pixel electrodes 252, and the third pixel electrodes 253 are sequentially and alternately arranged adjacent to each other in the second direction D2, and combinations of the first pixel electrode 251, the second pixel electrode 252, and the third pixel electrode 253 are sequentially and repeatedly arranged in the second direction D2.

The first pixel electrodes 251, the second pixel electrodes 252, and the third pixel electrodes 253 may each include a transparent conductive oxide, and for example, may each include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

A first common layer 261 may be formed on the substrate 2 so as to cover the first pixel electrodes 251, the second pixel electrodes 252, and the third pixel electrodes 253, that is, may be commonly formed on all of the pixels P.

The first common layer 261 may include a hole injection transport material.

As shown in FIG. 2, the first common layer 261 may include a $(1-1)_{th}$ common layer 261a and a $(1-2)_{th}$ common layer 261b. In this regard, the (1-1)th common layer 261a may be a hole injection layer (HIL) including a hole injection material. Examples of the hole injection material may include a phthalocyanine compound such as copper phthalocyanine or TCTA, m-MTDATA, or m-MTDAPB that is starburst-type amine. The $(1-2)_{th}$ common layer 261b may be a hole transport layer (HTL) including a hole transport material. Examples of the hole transport material may include N,N'-bis(3-methylphenyl)-N,N'-diphenyl-[1,1-biphenyl]-4,4'-diamine (TPD), or N,N'-di(naphtalene-1-il)-N, N'-diphenyl benzidine (α-NPD).

Although not shown, an interlevel layer may be further disposed between the $(1-1)_{th}$ common layer 261a and the $(1-2)_{th}$ common layer 261b. The interlevel layer may include a hole injection material and/or a hole transport material.

The plurality of third lines 273 are formed on the first common layer 261 so as to cover a region, which corresponds to the first sub-pixels. SP1 and the second sub-pixels SP2 that are arranged in the first direction D1 and are adjacent to each other in the second direction D2. Thus, a third width W3 of each third line 273, which is measured in the second direction D2, corresponds to (or is slightly less than) widths of the first sub-pixel SP1 and the second sub-pixel SP2 which are adjacent to each other, which are measured in the second direction D2. In addition, the third lines 273 may each have a linear structure that extends in the first direction D1.

The third lines 273 may include a hole injection transport material. In more detail, the third lines 273 may each include the above-described hole injection material and/or hole transport material.

According to the present embodiment, the third lines 273 cover the first sub-pixels SP1 and the second sub-pixels SP2. However, the present invention is not limited thereto. According to designed conditions of light usage efficiency and power consumption, the third lines 273 may be formed to cover two sub-pixels that are adjacent to each other, from among the first sub-pixels SP1, the second sub-pixel SP2, and the third sub-pixel SP3 that are arranged in the first direction D1.

The plurality of first lines 271 are formed on the respective third lines 273 so as to cover a region corresponding to the first sub-pixels SP1 arranged in the first direction D1. Thus, a first width W1 of each first line 271, which is measured in the second direction D2, corresponds to a width of each first sub-pixel SP1, which is measured in the second direction D2. The first lines 271 may each have a linear structure that extends in the first direction D1.

The first lines 271 may include a first organic light-emitting layer including a first organic light-emitting material, for example, a red organic light-emitting material for emitting red light.

The plurality of second lines 272 are formed on the respective third lines 273 so as to cover a region corresponding to the second sub-pixels SP2 that are arranged in the first direction D1. Thus, a second width W2 of each second line 272, which is measured in the second direction D2, corresponds to a width of the second sub-pixel SP2, which is measured in the second direction D2. In addition, the second lines 272 may each have a linear structure that extends in the first direction D1. Thus, a first line 271 and a second line 272, which are two lines extending in the first direction D1, may be arranged adjacent to each other in the second direction D2 on each of the third lines 273. FIGS. 1 and 2 show the case where the third width W3 is greater than the sum of the first width W1 and the second width W2. However, the present invention is not limited thereto. Alternatively, the third width W3 may be equal to or smaller than the sum of the first width W1 and the second width W2.

The second lines 272 may include a second organic light-emitting layer including a second organic light-emitting material that is different from the first organic light-emitting material, for example, a green organic light-emitting material for emitting green light.

The second common layer 262 is formed on a portion of the first common layer 261, a portion of the third lines 273, the first lines 271, and the second lines 272 so as to be shared by all of the pixels P.

The second common layer 262 may include a third organic light-emitting layer including a third organic light-emitting material that is different from the first organic light-emitting material and the second organic light-emitting material, for example, a blue organic light-emitting material for emitting blue light.

The above-described organic light-emitting materials may include a host material and a dopant material.

Examples of the host material may include tris(8-hydroxy-quinolinato)aluminum (Alq3), 9,10-di(naphti-2-il)anthracene (ADN), 2-Tert-butyl-9,10-di(naphti-2-il)anthracene (TBADN), 4,4'-bit(2,2-diphenyl-ethen-1-il)biphenyl (DPVBi), or 4,4'-bis(2,2-di(4-methylphenyl)-ethene-1-il)biphenyl (p-DMDPVBi).

Examples of the dopant material may include 4,4'-bis[4-(di-p-tolylamino)styryl]biphenyl (DPAVBi), 9,10-di(naph-2-til)anthracene (ADN), or 2-tert-butyl-9,10-di(naphti-2-il)anthracene (TBADN).

A third common layer 263 is formed on the second common layer 262 so as to be shared by all of the pixels P.

The third common layer 263 may include an electron injection transport material. Examples of the electron injection transport material may include LiF, NaCl, CsF, Li2O, BaO, Liq, or Alq3.

An opposite electrode 254 is formed on the third common layer 263 so as to be shared by all of the pixels P.

The opposite electrode 254 may be formed of metal such as silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), cobalt (Co), samarium (Sm), or calcium (Ca).

Since the second common layer 262 includes a third organic light-emitting layer, it is not necessary to pattern the third organic light-emitting layer. Thus, the number of masks required for patterning the third organic light-emitting layer may be reduced and deposition may be performed by using an open mask, thereby simplifying processes.

In the first sub-pixel SP1, the second sub-pixel SP2, and the third sub-pixel SP3, distances between the opposite electrode 254 and the first, second, and third pixel electrodes 251, 252, and 253 are different from each other, thereby increasing luminescent efficiency and lifetime of each sub-pixel. As described below, the distances may be obtained to cause optical resonance with regard to a wavelength of light emitted from each sub-pixel.

Due to the third lines 273, distances between the first and second pixel electrodes 251 and 252 and the opposite electrode 254 in the first sub-pixel SP1 and the second sub-pixel SP2 may each be greater than a distance between the third pixel electrode 253 and the opposite electrode 254 in the third sub-pixel SP3, thereby increasing luminescent efficiency.

Also, thicknesses of the first lines 271 and the second lines 272 may be different from each other so as to obtain an optimum luminescent efficiency of each sub-pixel.

Figure 3:
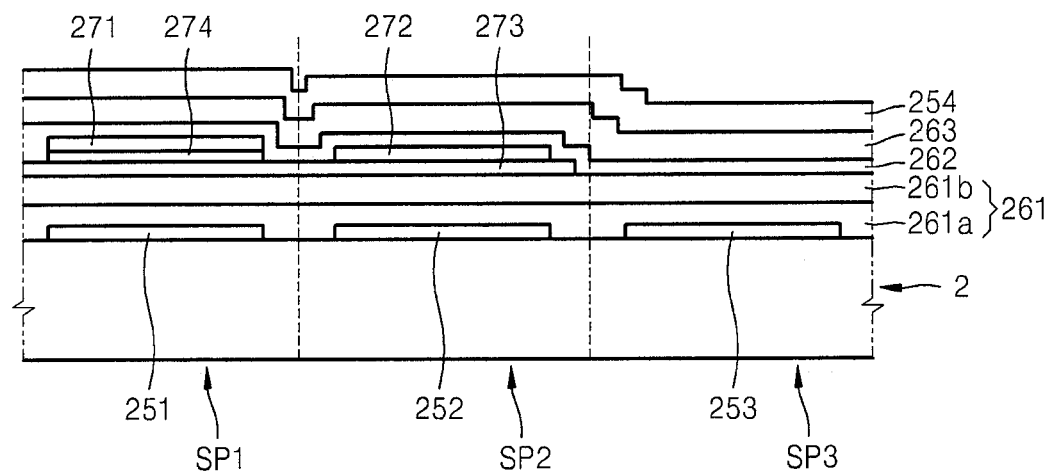
FIG. 3 is a cross-sectional view of the organic light-emitting display apparatus taken along line I-I of FIG. 1, according to another embodiment of the present invention.

FIG. 3 is a cross-sectional view of the organic light-emitting display apparatus taken along line I-I of FIG. 1, according to another embodiment of the present invention. Unlike in FIG. 2, according to the present embodiment shown in FIG. 3, a plurality of fourth lines 274 are further formed between the third lines 273 and the first lines 271 so as to cover a region corresponding to first sub-pixels SP1 that are arranged in the first direction D1. A fourth line 274 may be formed to have the same shape as the first line 271.

The fourth line 274 may include a hole injection transport material, in detail, a hole transport material.

The fourth line 274 may be formed between the third line 273 and the first line 271 such that a distance between the first pixel electrode 251 and the opposite electrode 254 in the first sub-pixel SP1 may be greater than in other sub-pixels, thereby increasing luminescent efficiency. According to the arrangement of the fourth lines 274, the thickness of the first line 271 may be reduced, thereby power consumption in the first sub-pixel SP1 may be reduced.

It is not required to interpose the fourth line 274 between the third line 273 and the first line 271. According to luminescent efficiency and power consumption conditions, the fourth line 274 may be formed to cover only one line of sub-pixels from among the first sub-pixels SP1, the second sub-pixels SP2, and the third sub-pixels SP3 that are arranged in the first direction D1.

Figure 4:
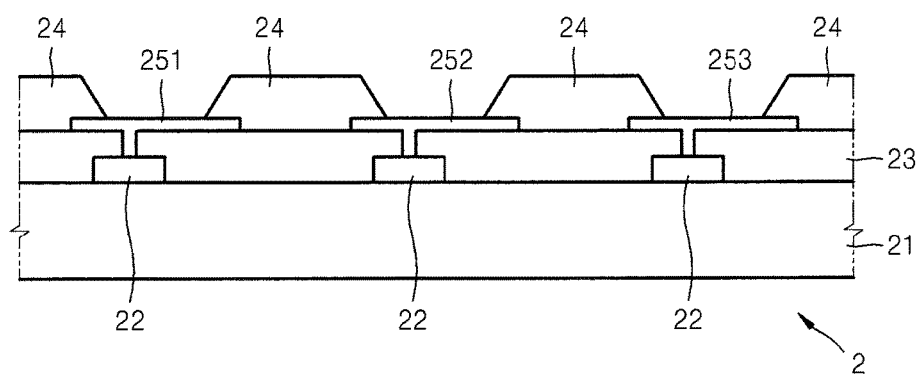
FIG. 4 is a cross-sectional view of a substrate of an organic light-emitting display apparatus, according to an embodiment of the present invention.

According to the present embodiment, as shown in FIG. 4, the substrate 2 may include a plurality of driving circuits 22. That is, the substrate 2 may include a base substrate 21, the driving circuits 22 formed on the base substrate 21, an insulating layer 23 covering the driving circuits 22, the first, second, third pixel electrodes 251, 252, and 253 formed on the insulating layer 23, and a pixel definition layer 24 that is formed on the insulating layer 23 so as to cover edges of the first, second, third pixel electrodes 251, 252, and 253.

The base substrate 21 may be formed of a glass material, a plastic material, or a metal material.

Each of the driving circuits 22 may include at least one thin film transistor and at least one capacitor.

The insulating layer 23 and the pixel definition layer 24 may include an organic layer and/or an inorganic layer.

As shown in FIG. 4, the substrate 2 may be used in a top emission-type organic light-emitting display apparatus in which an image is realized in an opposite direction to (i.e., in a direction facing oppositely away from) the base substrate 21.

Figure 5:
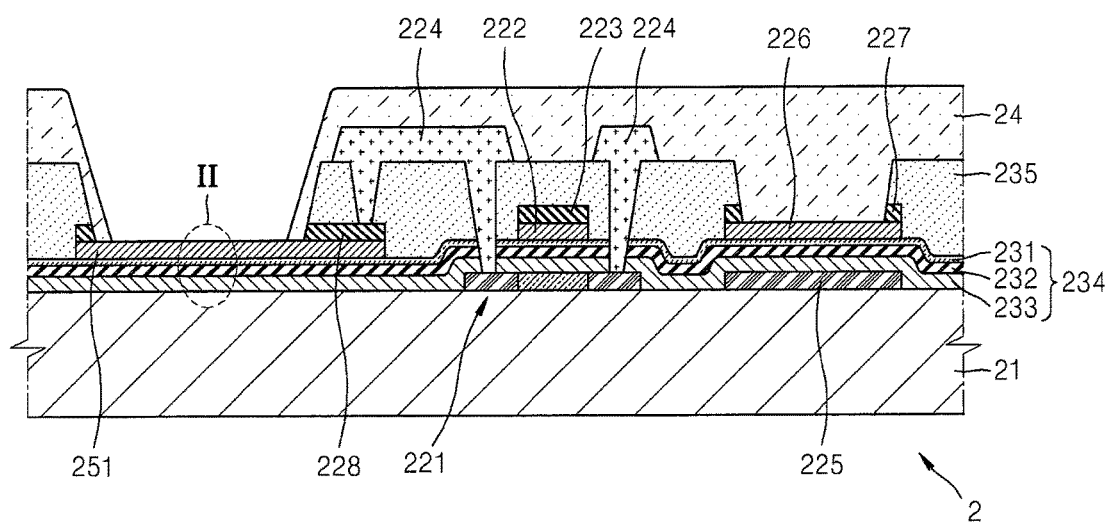
FIG. 5 is a cross-sectional view of a substrate of an organic light-emitting display apparatus, according to another embodiment of the present invention.
Figure 6:
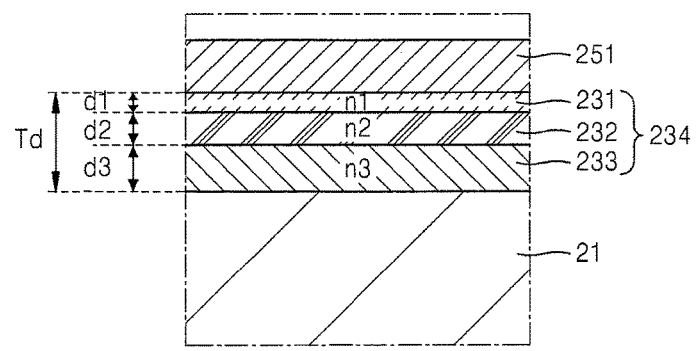
FIG. 6 is an enlarged diagram of portion II of FIG. 5, according to another embodiment of the present invention.

FIG. 5 is a cross-sectional view of the substrate 2 according to another embodiment of the present invention. The substrate 2 may be used in a bottom emission-type organic light-emitting display apparatus in which an image is realized in a direction toward the base substrate 21. FIG. 6 is an enlarged diagram of portion II of FIG. 5, according to another embodiment of the present invention.

Referring to FIG. 5, an active layer 221 of a transistor and a capacitor lower electrode 225 are formed on the base substrate 21. The base substrate 21 may be formed of a transparent glass material mainly having $SiO_2$. In addition, a buffer layer (not shown), including $SiO_2$ and/or $SiN_x$, may be formed on the base substrate 21 so as to make the base substrate 21 smooth and to prevent impurities from penetrating into the base substrate 21.

The active layer 221 may include polysilicon. In this regard, polysilicon may be formed by crystallizing amorphous silicon. Amorphous silicon may be crystallized by using various suitable methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method.

A refraction conversion layer 234 is formed to cover the active layer 221 and the capacitor lower electrode 225.

According to the present embodiment, the refraction conversion layer 234 is disposed between a first pixel electrode 251 and the base substrate 21 in order to prevent total reflection due to a difference in reflective indexes. The refraction conversion layer 234 functions as a gate insulating layer of a transistor and a dielectric layer of a capacitor.

Layers, including a transparent conductive oxide and metal, are sequentially stacked and patterned on the refraction conversion layer 234 so as to simultaneously or currently form the first pixel electrode 251, a first metal layer 228, first and second gate electrodes 222 and 223, a capacitor upper electrode 226, and a second metal layer 227.

A transparent conductive material for forming the first pixel electrode 251, the first gate electrode 222, and the capacitor upper electrode 226 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Metal for forming the first metal layer 228, the second gate electrode 223, and the second metal layer 227 may be at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may form a single layer or a plurality of layers.

Then, an interlevel insulating layer 235 is stacked as a pattern. Thus, upper portions of the first metal layer 228 and the second metal layer 227 are exposed. In addition, contact holes are formed to expose portions of the first metal layer 228 and the active layer 221 therethrough.

Then, a material for forming source and drain electrodes 224 is disposed on the interlevel insulating layer 235. The material for forming the source and drain electrodes 224 may be at least one selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may form a single layer or a plurality of layers.

The first metal layer 228 and the second metal layer 227 together with the material for forming the source and drain electrodes 224 may be patterned by using an etch process to form a structure shown in FIG. 5.

Then, the pixel definition layer 24 is formed and an opening exposing an upper surface of the first pixel electrode 251 is formed therein.

As shown in FIG. 6, the refraction conversion layer 234 has a structure in which a first layer 231, a second layer 232, and a third layer 233 are sequentially stacked from the top.

Since the base substrate 21 has a greater refractive index than that of air, total reflection may occur on an interface between the base substrate 21 and air. In addition, since the first pixel electrode 251 that is a transparent electrode has a refractive index of about 1.8 to about 2.2 and the base substrate 21 that is a transparent substrate has a refractive index of about 1.5, that is, the refractive index of the base substrate 21 is smaller than the refractive index of the first pixel electrode 251, a substantial degree of total reflection may occur on an interface between the first pixel electrode 251 and the base substrate 21.

The first layer 231 has a greater refractive index than that of the first pixel electrode 251. This is to prevent the total reflection from occurring on the interface between the first pixel electrode 251 and the base substrate 21 so as to prevent a reduction in luminescent efficiency. Thus, a refractive index of the first layer 231 may be set to be greater than about 1.8 to about 2.2 that is a refractive index of the first pixel electrode 251 including the above-described transparent conductive oxide. Examples of a material for forming the first layer 231, which satisfy this condition, may include oxide, nitride, or oxynitride including niobium (Nb), titanium (Ti), tantalum (Ta), zirconium (Zr), molybdenum (Mo), or the like. However, the present invention is not limited thereto. The first layer 231 may be formed of various suitable materials having a greater refractive index than that of the first pixel electrode 251.

The second layer 232 of the refraction conversion layer 234 may be formed of a material having a smaller refractive index than that of the first layer 231, and the third layer 233 may be formed of a material having a smaller refractive index than that of the second layer 232. That is, a refractive index of the refraction conversion layer 234 gradually decreases from the first pixel electrode 251 toward the base substrate 21, thereby reducing a difference in color conversion due to a change in view angle of an organic light-emitting display apparatus, which is caused by a change in refractive index.

Inversely to the refractive indexes of the first layer 231, the second layer 232, and the third layer 233, which are included in the refraction conversion layer 234, a thickness d1 of the first layer 231 of the refraction conversion layer 234 may be smaller than a thickness d2 of the second layer 232, and the thickness d2 of the second layer 232 may be smaller than a thickness d3 of the third layer 233. In addition, light transmittance of the first layer 231 of the refraction conversion layer 234 may be smaller than that of the second layer 232, and the light transmittance of the second layer 232 may be smaller than that of the third layer 233. For example, various suitable combinations may be used, that is, the thickness d1 of the first layer 231 may be about 20 nm, the thickness d2 of the second layer 232 may be about 40 nm, and the thickness d3 of the third layer 233 may be about 60 nm. However, a total thickness Td of the refraction conversion layer 234 may be maintained constant. When the total thickness Td of the refraction conversion layer 234 is too thick, light transmittance of the refraction conversion layer 234 may deteriorate.

The second layer 232 and the third layer 233 of the refraction conversion layer 234 may be formed of silicon nitride (SiNx) having a refractive index of about 2.0 and silicon oxide ($SiO_2$) having a refractive index of about 1.5, respectively.

Since the third layer 233 that directly contacts the active layer 221 is formed of silicon oxide ($SiO_2$), the influence of a threshold voltage (Vth) generated during formation of a channel of a transistor may be reduced.

When the active layer 221 is formed of polysilicon, since a gate insulating layer is formed of silicon nitride, transistor properties may be increased. It is deemed that hydrogen supplied from silane gas used in a process of forming silicon nitride is filled in a defect side of the active layer 221 formed of polysilicon, thereby increasing the electron mobility of the transistor.

Since the refraction conversion layer 234 functions as a gate insulating layer, the total thickness Td of the refraction conversion layer 234 may be maintained constant. For example, the total thickness Td may be about 2 nm to about 200 nm. When the thickness Td is too thin, the amount of leak current may increase. When the thickness Td is too thick, the size of a device is increased.

The refraction conversion layer 234 may also function as a dielectric layer of a capacitor. With regard to a capacitor using a dielectric layer formed of silicon oxide only, when the thickness of the dielectric layer is reduced in order to increase a capacitance, a static electricity issue may arise. Thus, by using the second layer 232 and the first layer 231 including silicon nitride having a greater dielectric constant than that of silicon oxide as a dielectric layer, the static electricity issue may be prevented and a capacitance may be increased.

The capacitor lower electrode 225 may be formed of polysilicon, like the active layer 221. In this case, since hydrogen supplied from silane gas used in a process of forming silicon nitride used for forming a dielectric layer is filled in a defect site of the capacitor lower electrode 225 formed of polysilicon, defects of a capacitor may be overcome.

Since the refraction conversion layer 234 functions as a dielectric layer of a capacitor, the total thickness Td of the refraction conversion layer 234 may be maintained constant. For example, the total thickness Td of the refraction conversion layer 234 may be about 2 to about 200 nm. When the total thickness Td is too thin, static electricity may be generated. When the total thickness Td is too thick, the size of a device may be increased.

Figure 7:
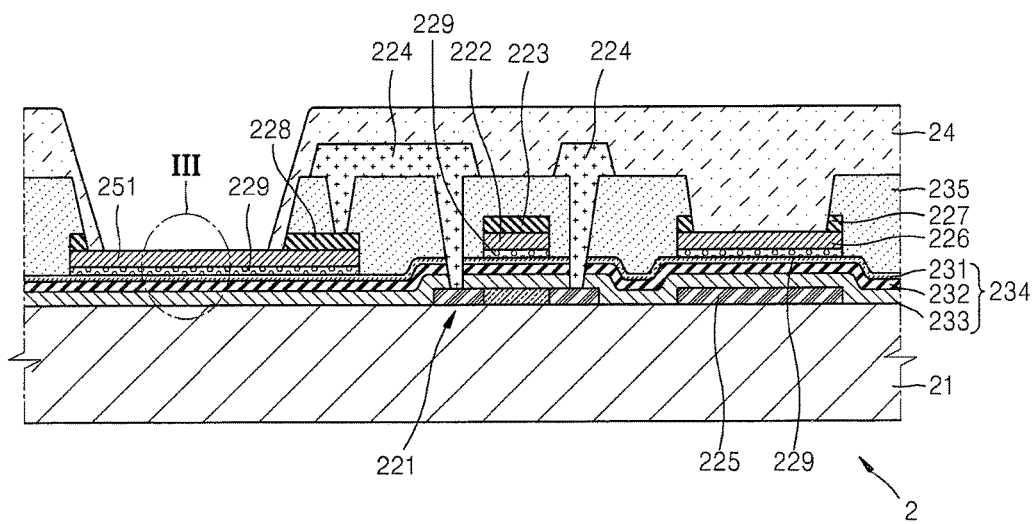
FIG. 7 is a cross-sectional view of a substrate of an organic light-emitting display apparatus, according to another embodiment of the present invention.
Figure 8:
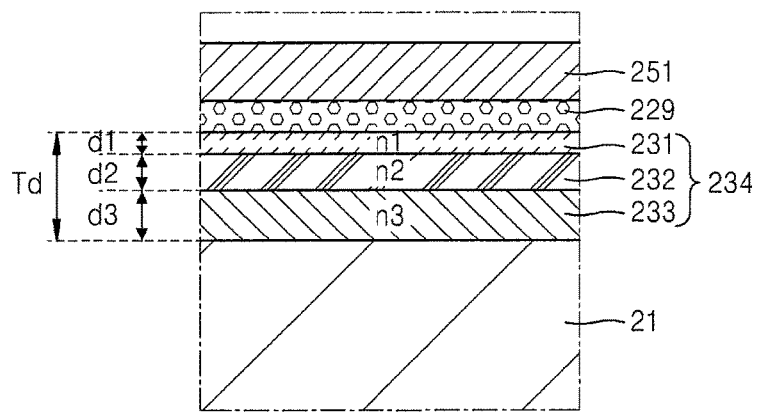
FIG. 8 is an enlarged diagram of portion III of FIG. 7, according to another embodiment of the present invention.

FIG. 7 is a cross-sectional view of the substrate 2 according to another embodiment of the present invention. The substrate 2 may be used in a bottom emission-type organic light-emitting display apparatus in which an image is realized in a direction toward the base substrate 21. FIG. 8 is an enlarged diagram of portion III of FIG. 7, according to another embodiment of the present invention.

The substrate 2 shown in FIGS. 7 and 8 may further include a semi-transparent reflective layer 229 between the first pixel electrode 251 and the refraction conversion layer 234, compared to the substrate 2 shown in FIGS. 5 and 6. The semi-transparent reflective layer 229 may resonate light emitted from an organic light-emitting layer between the semi-transparent reflective layer 229 and the above-described opposite electrode 254 (see FIG. 2 or 3) to increase luminescent efficiency.

The semi-transparent reflective layer 229 may be formed of aluminum (Al), silver (Ag), or an Ag alloy. Examples of the Ag alloy may further include palladium (Pd) and copper (Cu), in addition to Ag as a main element.

The semi-transparent reflective layer 229 may be formed to have a thickness of about 50 to about 200 Å. In one embodiment, when the thickness of the semi-transparent reflective layer 229 is smaller than 50 Å, since reflectivity is reduced, it is difficult to obtain an optical resonance between the semi-transparent reflective layer 229 and an opposite electrode that is a reflective electrode. In another embodiment, when the thickness of the semi-transparent reflective layer 229 is greater than 200 Å, since light transmittance is reduced, luminescent efficiency is also reduced.

The semi-transparent reflective layer 229 may also be interposed between the first gate electrode 222 and the refraction conversion layer 234 and between the capacitor upper electrode 226 and the refraction conversion layer 234.

Other elements shown in FIGS. 7 and 8 are the same as those shown in FIGS. 5 and 6, and thus, a detailed description thereof is omitted herein.

Figure 9:
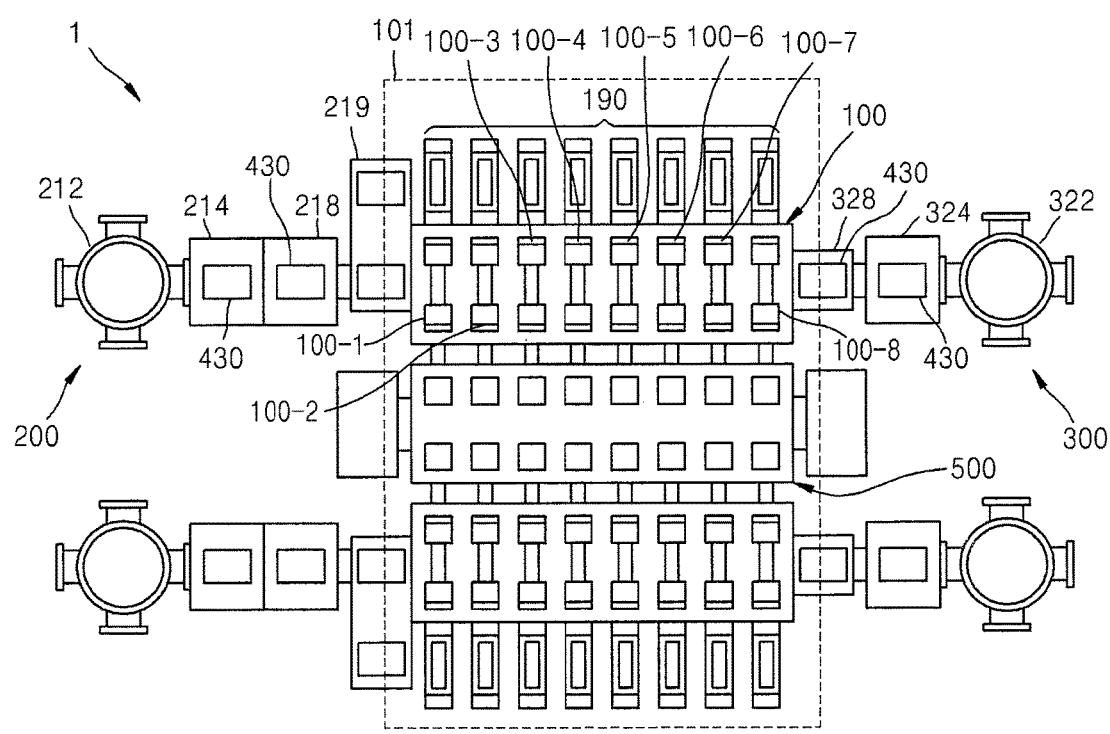
FIG. 9 is a plan view of a system of a deposition apparatus for manufacturing an organic light-emitting display apparatus, according to an embodiment of the present invention.
Figure 10:
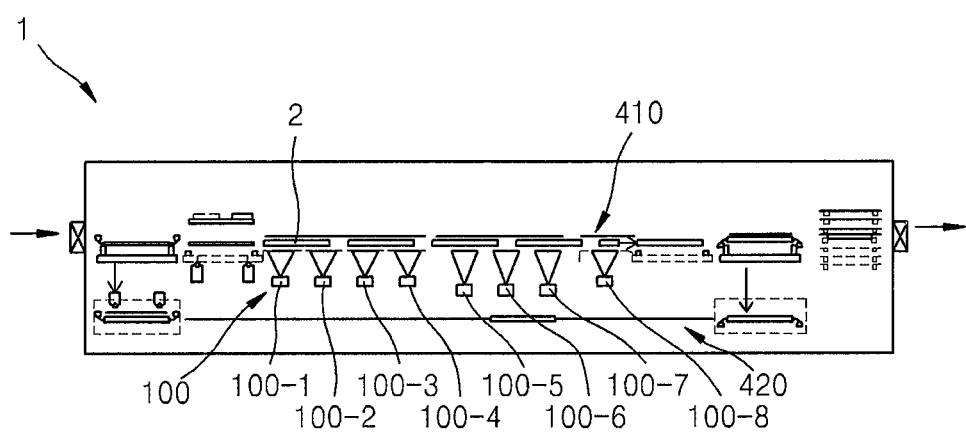
FIG. 10 is a side view of the system including a deposition unit of the deposition apparatus of FIG. 9, according to an embodiment of the present invention.

FIG. 9 is a plan view of a system of a deposition apparatus 1 for manufacturing an organic light-emitting display apparatus, according to an embodiment of the present invention. FIG. 10 is a side view of a system including a deposition unit 100 of the deposition apparatus 1 of FIG. 9, according to an embodiment of the present invention.

A deposition process may be performed on the substrate 2 shown in FIGS. 4 to 8 using the system shown in FIGS. 9 and 10 so as to form the organic light-emitting display apparatus shown in FIGS. 1 and 2.

Figure 11:
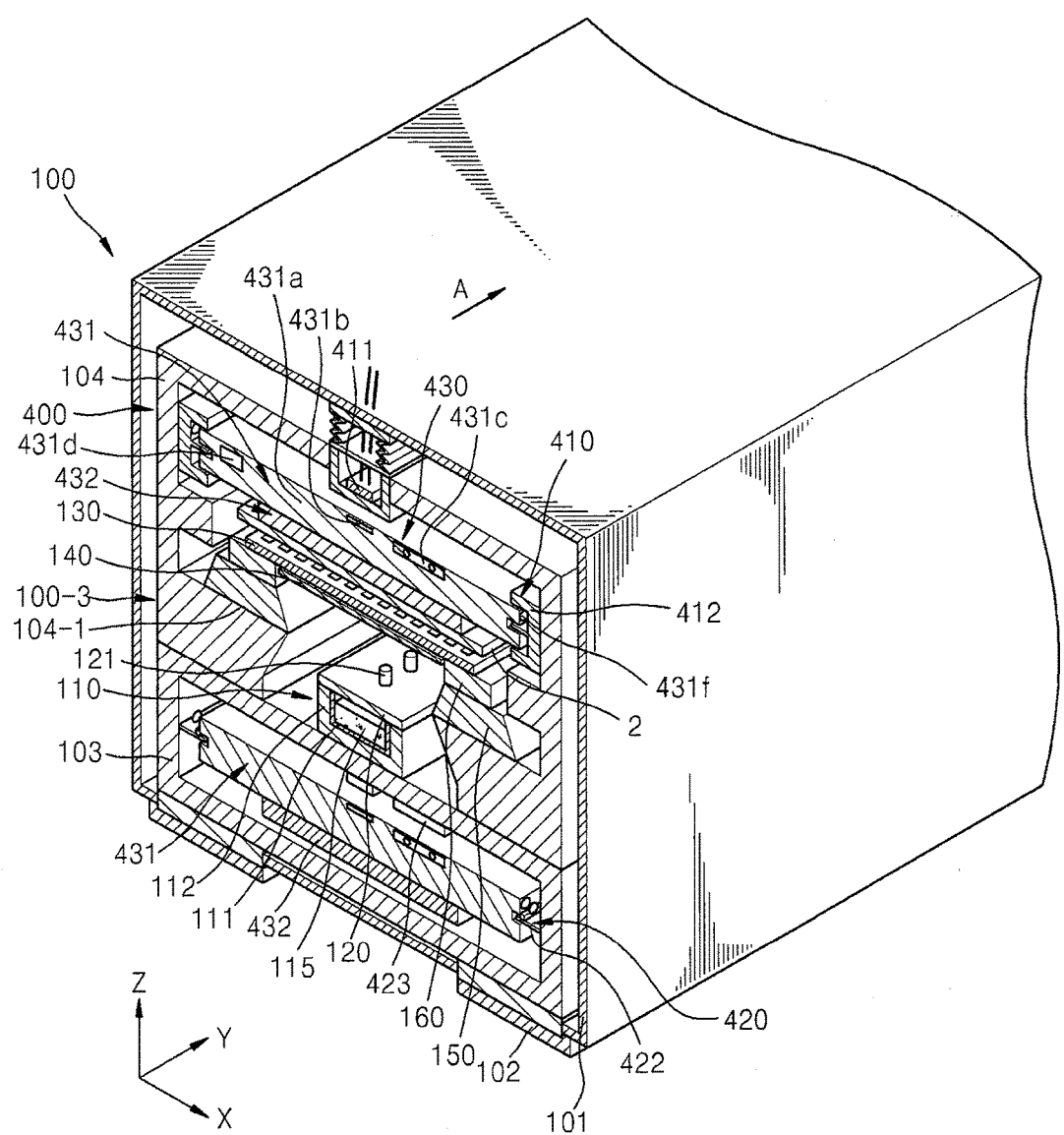
FIG. 11 is a perspective view of a portion of the deposition unit shown in FIGS. 9 and 10, according to an embodiment of the present invention.

Referring to FIGS. 9 and 10, the deposition apparatus 1 includes the deposition unit 100, a loading unit 200, an unloading unit 300, and a conveyer unit 400 (refer to FIG. 11).

The loading unit 200 may include a first rack 212, a transport chamber 214, a first inversion chamber 218, and a buffer chamber 219.

A plurality of substrates onto which a deposition material has not yet been applied are stacked up on the first rack 212. A transport robot (not shown) included in the transport chamber 214 picks up one of the substrates from the first rack 212, and disposes it on a transfer unit 430 transferred by a second conveyer unit 420. The transfer unit 430 on which the substrate is disposed is moved into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 9, the transport robot of the transport chamber 214 places one of the substrates on a top surface of the transfer unit 430, and the transfer unit 430 on which the substrate 2 is disposed is then transferred into the first inversion chamber 218. The first inversion robot of the first inversion chamber 218 inverts the transfer unit 430 in the first inversion chamber 218 so that the substrate is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate is disposed on the transfer unit 430, and then moves the transfer unit 430 on which the substrate is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when disposing the substrate on the transfer unit 430, the substrate may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. As illustrated in FIGS. 9 and 10, the deposition unit 100 includes a chamber 101 in which a plurality of deposition assemblies (100-1)(100-2) . . . (100-8) may be disposed. Referring to FIG. 9, 8 deposition assemblies, i.e., a first deposition assembly (100-1), a second deposition assembly (100-2), . . . and an eighth deposition assembly (100-8), are disposed in the chamber 101, but the number of deposition assemblies may vary with a desired deposition material and deposition conditions. The chamber 101 is maintained in vacuum during a deposition process.

In the embodiment illustrated in FIGS. 9 and 10, the transfer unit 430 with the substrate fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate in the unloading unit 300 may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate is separated.

The deposition apparatus 1 is configured such that the first conveyer unit 410 and the second conveyer unit 420 are respectively disposed above and below so that after the transfer unit 430, on which deposition has been completed while being passed by the first conveyer unit 410, is separated from the substrate 2 in the unloading unit 300, and the transfer unit 430 is returned to the loading unit 200 via the second conveyer unit 420 formed below the first conveyer unit 410, and thus, the organic layer deposition apparatus 1 may have an improved space utilization efficiency.

The deposition unit 100 of FIG. 9 may further include a deposition source replacement unit 190 disposed at a side of each organic layer deposition assembly of the deposition unit 100. Although not particularly illustrated in the drawings, the deposition source replacement unit 190 may be formed as a cassette-type that may be drawn to the outside from each deposition assembly. Thus, a deposition source 110 (refer to FIG. 11) of the deposition assemblies 100-1 . . . 100-8 may be easily replaced.

FIG. 9 illustrates the deposition apparatus 1 in which two sets of structures each including the loading unit 200, the deposition unit 100, the unloading unit 300, and the conveyer unit 400 are arranged in parallel. In such an embodiment, a patterning slit sheet replacement unit 500 may be disposed between the two deposition apparatuses 1. That is, due to this configuration of structures, the two deposition apparatuses 1 share the patterning slit sheet replacement unit 500, resulting in improved space utilization efficiency, as compared to a case where each deposition apparatus 1 includes the patterning slit sheet replacement unit 500.

The deposition assemblies 100-1 . . . 100-8 shown in FIGS. 9 and 10 are used to form each layer shown in FIGS. 1 and 2.

For example, the first deposition assembly 100-1 forms the $(1\text{-}1)_{th}$ common layer 261a and the second deposition assembly 100-2 forms the $(1\text{-}2)_{th}$ common layer 261b. The third deposition assembly 100-3 forms the third lines 273, the fourth deposition assembly 100-4 forms the first lines 271, and the fifth deposition assembly 100-5 forms the second lines 272. The sixth deposition assembly 100-6 forms the second common layer 262, the seventh deposition assembly 100-7 forms the third common layer 263, and the eighth deposition assembly 100-8 forms an opposite electrode 254. The opposite electrode 254 may be formed by using other deposition apparatuses other than the deposition assemblies 100-1 . . . 100-8 shown in FIGS. 9 and 10.

Since the $(1\text{-}1)_{th}$ common layer 261a, the $(1\text{-}2)_{th}$ common layer 261b, the second common layer 262, the third common layer 263, and the opposite electrode 254 are formed to be shared by all pixels, the first deposition assembly 100-1, the second deposition assembly 100-2, the sixth deposition assembly 100-6, the seventh deposition assembly 100-7, and the eighth deposition assembly 100-8 may be common type deposition assemblies. The common-layer deposition assemblies may each have an opening having a patterning slit sheet 130 (refer to FIG. 11) that is open to all pixels, which is described below. Like in FIGS. 9 and 10, the number of the common-layer deposition assemblies may correspond to the number of common layers. However, the present invention is not limited thereto. That is, a common-layer deposition assembly for depositing the same material may be repeatedly used.

Since the third lines 273, the first lines 271, and the second lines 272 are each formed to have a linear shape, the third deposition assembly 100-3, the fourth deposition assembly 100-4, and the fifth deposition assembly 100-5 are each a linear-layer (pattern-layer) deposition assembly. The linear-layer deposition assembly has an opening pattern having a width corresponding to a width of each line for forming the patterning slit sheet 130 (refer to FIG. 11).

A linear-layer deposition assembly for forming the fourth lines 274 may further be used to form the organic light-emitting display apparatus of FIG. 3.

Figure 12:
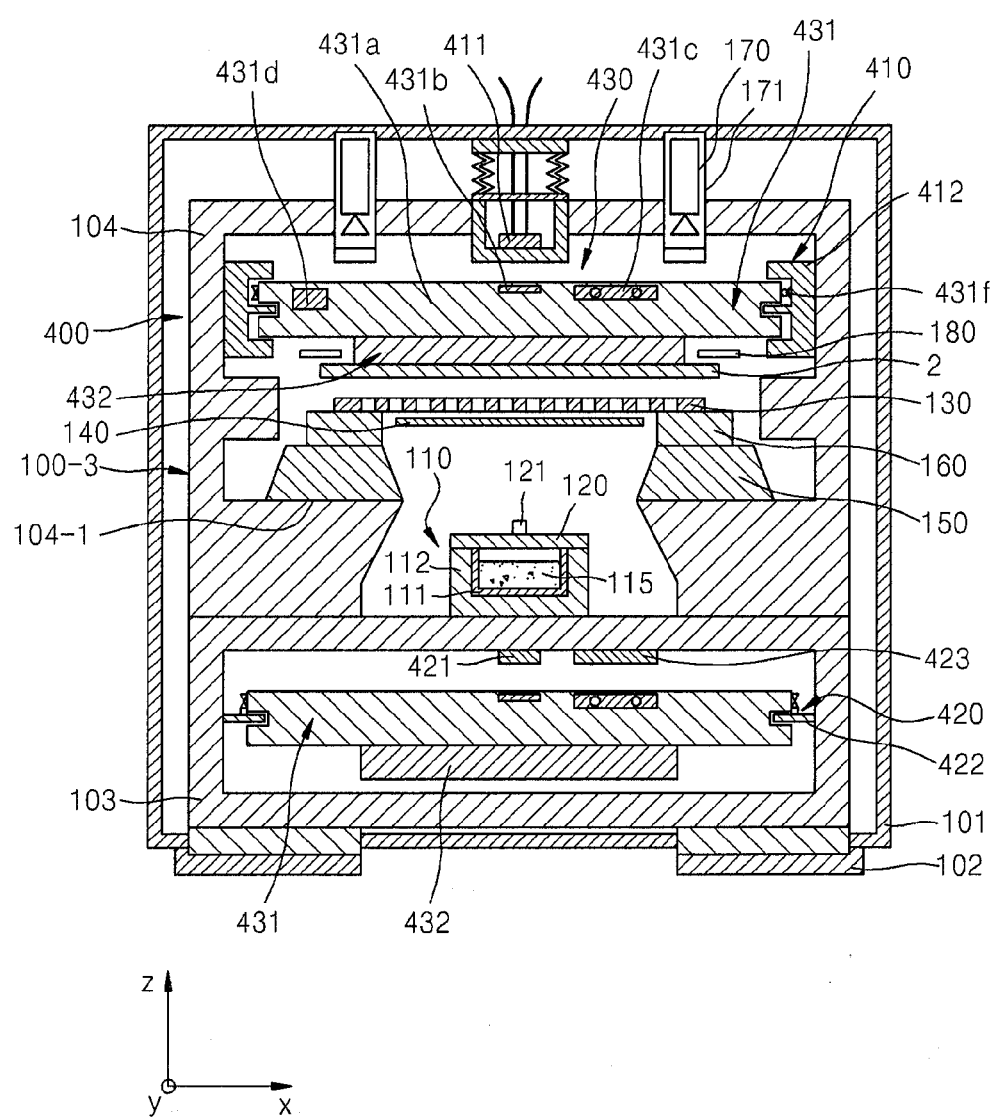
FIG. 12 is a schematic cross-sectional diagram of the deposition unit of FIG. 11, according to an embodiment of the present invention.

FIG. 11 is a perspective view of a portion of the deposition unit 100 shown in FIGS. 9 and 10, according to an embodiment of the present invention. FIG. 12 is a schematic cross-sectional diagram of the deposition unit 100 of FIG. 11, according to an embodiment of the present invention.

FIGS. 11 and 12 show the third deposition assembly 100-3 that is a linear-layer deposition assembly of the deposition unit 100.

Hereinafter, an overall structure of the deposition unit 100 will be described.

The chamber 101 may be formed as a hollow box type and accommodate the third deposition assembly 100-3 and the conveyer unit 400. A foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the third deposition assembly 100-3 and the first conveyer unit 410 of the conveyer unit 400, and the lower housing 103 includes the second conveyer unit 420 of the conveyer unit 400. While the transfer unit 430 is cyclically moved by both the first conveyer unit 410 and the second conveyer unit 420, a deposition process is continuously performed.

Hereinafter, constituents of the third deposition assembly 100-3 are described in more detail.

The third deposition assembly 100-3 includes the deposition source 110, a deposition source nozzle unit 120, the patterning slit sheet 130, a shielding member 140, a first stage 150, a second stage 160, a camera 170, and a sensor 180. In this regard, all the elements illustrated in FIGS. 11 and 12 may be arranged in the chamber 101 maintained in an appropriate vacuum state. This structure is needed to achieve the linearity of a deposition material.

In particular, in order to deposit a deposition material 115 that, has been discharged from the deposition source 110 and passed through the deposition source nozzle unit 120 and the patterning slit sheet 130, onto a substrate 2 in a desired pattern, it is desirable to maintain a chamber (not shown) in the same vacuum state as that used in a deposition method of a fine metal mask (FMM). In addition, the temperature of the patterning slit sheet 130 needs to be sufficiently lower than that of the deposition source 110 because thermal expansion of the patterning slit sheet 130 by heat may be minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays may be used as the substrate 2.

According to an embodiment, the deposition process may be performed with the substrate 2 being moved relative to the third deposition assembly 100-3.

In the third deposition assembly 100-3, deposition may be performed while the third deposition assembly 100-3 and the substrate 2 are moved relative to each other. In other words, deposition may be continuously performed while the substrate 2, which faces the third deposition assembly 100-3, is moved in a Y-axis direction. That is, deposition is performed in a scanning manner while the substrate 2 is moved in a direction of arrow A illustrated in FIG. 11. Although the substrate 2 is illustrated as being moved in the Y-axis direction in a chamber (not shown) in FIG. 11 when deposition is performed, the present invention is not limited thereto. For example, deposition may be performed while the third deposition assembly 100-3 is moved in the Y-axis direction and the substrate 2 is held in a fixed position.

Thus, in the third deposition assembly 100-3, the patterning slit sheet 130 may be much smaller than in an FMM method used in a conventional deposition method. In other words, in the third deposition assembly 100-3, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in all the manufacturing processes, including etching followed by precise elongation, welding, transferring, and washing processes, than the FMM used in a conventional deposition method. In addition, this is more advantageous for manufacturing a relatively large display device.

In order to perform deposition while the third deposition assembly 100-3 and the substrate 2 are moved relative to each other as described above, the third deposition assembly 100-3 and the substrate 2 may be spaced apart from each other by a certain distance. This is described below in more detail.

The deposition source 110 that contains and heats the deposition material 115 is disposed at a side opposite to (facing) a side at which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source 110, in one embodiment, is disposed at a side of the deposition source 110 facing the substrate 2. In this regard, the deposition assemblies according to the present embodiment may each include different deposition nozzles 121 in performing deposition for forming common layers and pattern layers. That is, although not shown, the plurality of deposition nozzles 121 may be formed in a deposition source nozzle unit for forming a pattern layer in a Y-axis direction, that is, in a scan direction of the substrate 2. Thus, only one deposition nozzle 121 is formed in an X-axis direction, thereby sufficiently preventing shadows. On the other hand, the plurality of deposition nozzles 121 may be formed in the X-axis direction in a deposition source nozzle unit for forming a common layer. Thus, a thickness uniformity of the common layer may be improved.

In one embodiment, the patterning slit sheet 130 may be disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance.

As described above, deposition is performed while the third deposition assembly 100-3 is moved relative to the substrate 2. In order for the third deposition assembly 100-3 to be moved relative to the substrate 2, the patterning slit sheet 130 is disposed spaced apart from the substrate 2 by a certain distance.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM may occur. In addition, since it is difficult to move the mask with respect to the substrate, the mask and the substrate need to be formed with the same size. Accordingly, the mask needs to be larger as the size of a display device increases. However, it is difficult to form a large mask.

To address these problems, in the third deposition assembly 100-3 according to the present embodiment, the patterning slit sheet 130 is formed spaced apart by a certain distance from the substrate 2 on which a deposition material is to be deposited.

According to the present embodiment, deposition may be performed while a mask formed smaller than a substrate is moved with respect to the substrate, and thus, it is easy to manufacture the mask. In addition, defects due to contact between the substrate and the mask may be prevented. In addition, since it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 110 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may thereby be concurrently or simultaneously guided.

The shielding member 140 may be disposed between the patterning slit sheet 130 and the deposition source 110. In particular, various electrodes and/or wirings patterns are formed on an edge portion of the substrate 2 and are used as a terminal for inspecting a product or in manufacturing a product. If an organic material is applied on a region of the substrate 2, various electrodes and/or wirings patterns may not function properly. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it may not be easy to prevent the organic material from being deposited on the non-film-forming region of the substrate 2. Although not shown in detail, the shielding member 140 may include two plates that are adjacent to each other.

When the substrate 2 does not pass through the third deposition assembly 100-3, the shielding member 140 screens the deposition source 110, and thus, the deposition material 115 discharged from the deposition source 110 does not reach the patterning slit sheet 130. When the substrate 2 enters into the third deposition assembly 100-3 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. On the other hand, while the substrate 2 is passing through the third deposition assembly 100-3, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

Referring to FIGS. 11 and 12, the conveyer unit 400 includes the first conveyer unit 410, the second conveyer unit 420, and the transfer unit 430.

The first conveyer unit 410 conveys in an in-line manner the transfer unit 430, including a carrier 431 and an electrostatic chuck 432 attached thereto, and the substrate 2 attached to the transfer unit 430 so that an organic layer may be formed on the substrate 2 by the third deposition assembly 100-3. The first conveyer unit 410 includes the coil 411, guide members 412, upper magnetically suspended bearings, side magnetically suspended bearings, and gap sensors.

The second conveyer unit 420 returns to the loading unit 200 the transfer unit 430 from which the substrate 2 has been separated in the unloading unit 300 to complete one deposition cycle by passing the transfer unit 430 through the deposition unit 100 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed by the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

The carrier 431 of the transfer unit 430 will now be described in more detail.

The carrier 431 includes a main body part 431*a*, a linear motor system (LMS) magnet 431*b*, contactless power supply (CPS) modules 431*c*, a power supply unit 431*d*, and guide grooves.

The main body part 431*a* constitutes a base part of the carrier 431 and may be formed of a magnetic material such as iron. In this regard, due to a repulsive force between the main body part 431*a* and the respective upper and side magnetically suspended bearings, the carrier 431 may be maintained spaced apart from the guide members 412 by a certain distance.

The guide grooves may be respectively formed at both sides of the main body part 431*a* and each may accommodate a guide protrusion of the guide member 412.

The LMS magnet 431*b* may be formed along a center line of the main body part 431*a* in a direction where the main body part 431*a* proceeds. The LMS magnet 431*b* and the coil 411, which are described below, may be combined with each other to constitute a linear motor, and the carrier 431 may be conveyed in an arrow A direction by the linear motor.

The CPS modules 431*c* and the power supply unit 431*d* may be respectively formed on both sides of the LMS magnet 431*b* in the main body part 431*a*. The power supply unit 431*d* is a battery for charging that provides power so that the electrostatic chuck 432 chucks the substrate 2 and maintains operating. The CPS modules 431*c* are a wireless charging module that charges the power supply unit 431*d*. The charging track 423 formed in the second conveyer unit 420 is connected to an inverter (not shown), and thus, when the carrier 431 is transferred into the second conveyer unit 420, a magnetic field is formed between the charging track 423 and the CPS modules 431*c* so as to supply power to the CPS modules 431*c*. The power supplied to the CPS modules 431*c* is used to charge the power supply unit 431*d*.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the transfer unit 430 is described in more detail.

The LMS magnet 431*b* of the main body part 431*a* and the coil 411 may be combined with each other to constitute a driver. In this case, the driver may be a linear motor. The linear motor has a small frictional coefficient, little position error, and a very high degree of position determination, as compared to a conventional slide guide system. As described above, the linear motor may include the coil 411 and the LMS magnet 431*b*. The LMS magnet 431*b* is linearly disposed in the carrier 431, and a plurality of the coils 411 may be disposed at an inner side of the chamber 101 by a certain distance so as to face the LMS magnet 431*b*. Since the LMS magnet 431*b* is disposed in the carrier 431 instead of the coil 411, the carrier 431 may be operable without power being supplied thereto. In this regard, the coil 411 may be formed in an atmosphere (ATM) box in an atmosphere state. The LMS magnet 431*b* is attached to the carrier 431 such that the carrier 431 may be moved in the chamber 101 in vacuum.

Hereinafter, the first conveyer unit 410 and the transfer unit 430 are described in more detail.

Referring to FIG. 12, the first conveyer unit 410 conveys the electrostatic chuck 432 that fixes the substrate 2 and conveys the carrier 431 that conveys the electrostatic chuck 432. In this regard, the first conveyer unit 410 includes the coil 411, the guide members 412, upper magnetically suspended bearings, side magnetically suspended bearings, and gap sensors.

The coil 411 and the guide members 412 are formed inside the upper housing 104. The coil 411 is formed in an upper portion of the upper housing 104, and the guide members 412 are respectively formed on both inner sides of the upper housing 104.

The guide members 412 guide the carrier 431 to move in a direction. In this regard, the guide members 412 are formed to pass through the deposition unit 100.

The side magnetically suspended bearings are each disposed in the guide member 412 so as to respectively correspond to both sides of the carrier 431. The side magnetically suspended bearings form a distance between the carrier 431 and the guide member 412 so that the carrier 431 is moved along the guide members 412 in non-contact with the guide members 412. That is, a repulsive force R1 occurring between the side magnetically suspended bearings on the left side of in FIG. 12 and the carrier 431, which is a magnetic material, and a repulsive force R2 occurring between the side magnetically suspended bearings on the right side in FIG. 12 and the carrier 431, which is a magnetic material, maintain equilibrium, and thus, there is a constant distance between the carrier 431 and the respective guide members 412.

Each upper magnetically suspended bearing may be disposed in the guide members 412 so as to be above the carrier 431. The upper magnetically suspended bearings enable the carrier 431 to be moved along the guide members 412 in non-contact with the guide members 412 and with a constant distance therebetween. That is, a repulsive force (or alternatively an attractive force) occurring between the upper magnetically suspended bearing and the carrier 431, which is a magnetic material, and gravity maintain equilibrium, and thus, there is a constant distance between the carrier 431 and the respective guide members 412.

Each guide member 412 may further include the gap sensor. The gap sensor may measure a distance between the carrier 431 and the guide member 412. In addition, the gap sensor may be disposed at a side of the side magnetically suspended bearing. The gap sensor disposed at a side of the side magnetically suspended bearing may measure a distance between a side surface of the carrier 431 and the side magnetically suspended bearing.

Magnetic forces of the upper and side magnetically suspended bearings may vary according to values measured by the gap sensors, and thus, distances between the carrier 431 and the respective guide members 412 may be adjusted in real time. That is, a precise transfer of the carrier 431 may be feedback controlled using the upper and side magnetically suspended bearings and the gap sensors.

Hereinafter, the second conveyer unit 420 and the transfer unit 430 are described in detail.

Referring back to FIG. 12, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. The coil 421 may be disposed in an ATM box, as the coil 411 of the first conveyer unit 410.

The LMS magnet 431*b* of the main body part 431*a* of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 11.

The roller guides 422 guide the carrier 431 to move in a direction. In this regard, the roller guides 422 are formed to pass through the deposition unit 100.

The second conveyer unit 420 is used in a process of returning the carrier 431 from which the substrate 2 has been separated and not in a process of depositing an organic material on the substrate 2, and thus, a position accuracy thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the deposition apparatus. Although not illustrated in FIG. 4, magnetic suspension may also be applied to the second conveyer unit 420, as in the first conveyer unit 410.

The third deposition assembly 100-3 of the deposition apparatus 1 according to the present embodiment may further include the camera 170 and the sensor. In more detail, the camera 170 may align in real time a first alignment mark (not shown) formed in the frame 135 of the patterning slit sheet 130 and a second alignment mark (not shown) formed on the substrate 2. In this regard, the camera 170 is disposed to more accurately view inside the chamber 101 maintained in vacuum during deposition. For this, the camera 170 may be installed in a camera accommodation unit 171 in an atmospheric state.

Since the substrate 2 and the patterning slit sheet 130 are spaced apart from each other by a certain distance, distances between the substrate 2 and, the patterning slit sheet 130 that are disposed at different positions need to be both measured using the camera 170. For this operation, the third deposition assembly 100-3 of the deposition apparatus 1 may include a sensor. In this regard, the sensor may be a confocal sensor. The confocal sensor may scan an object to be measured by using laser beams that rotate at a high speed by using a scanning mirror and measure a distance to the object by using fluorescent or reflected rays emitted by the laser beams. The confocal sensor may measure a distance by sensing a boundary interface between different media.

Since a distance between the substrate 2 and the patterning slit sheet 130 is measurable in real time using the camera 170 and the sensor, the substrate 2 may be aligned with the patterning slit sheet 130 in real time, whereby position accuracy of a pattern may be significantly improved.

The first deposition assembly 100-1, the second deposition assembly 100-2, the fourth deposition assembly 100-4, . . . the eighth deposition assembly 100-8 may each be the same as the third deposition assembly 100-3, except for an opening pattern of the patterning slit sheet 130 and materials accommodated in the crucible 111.

Figure 13:
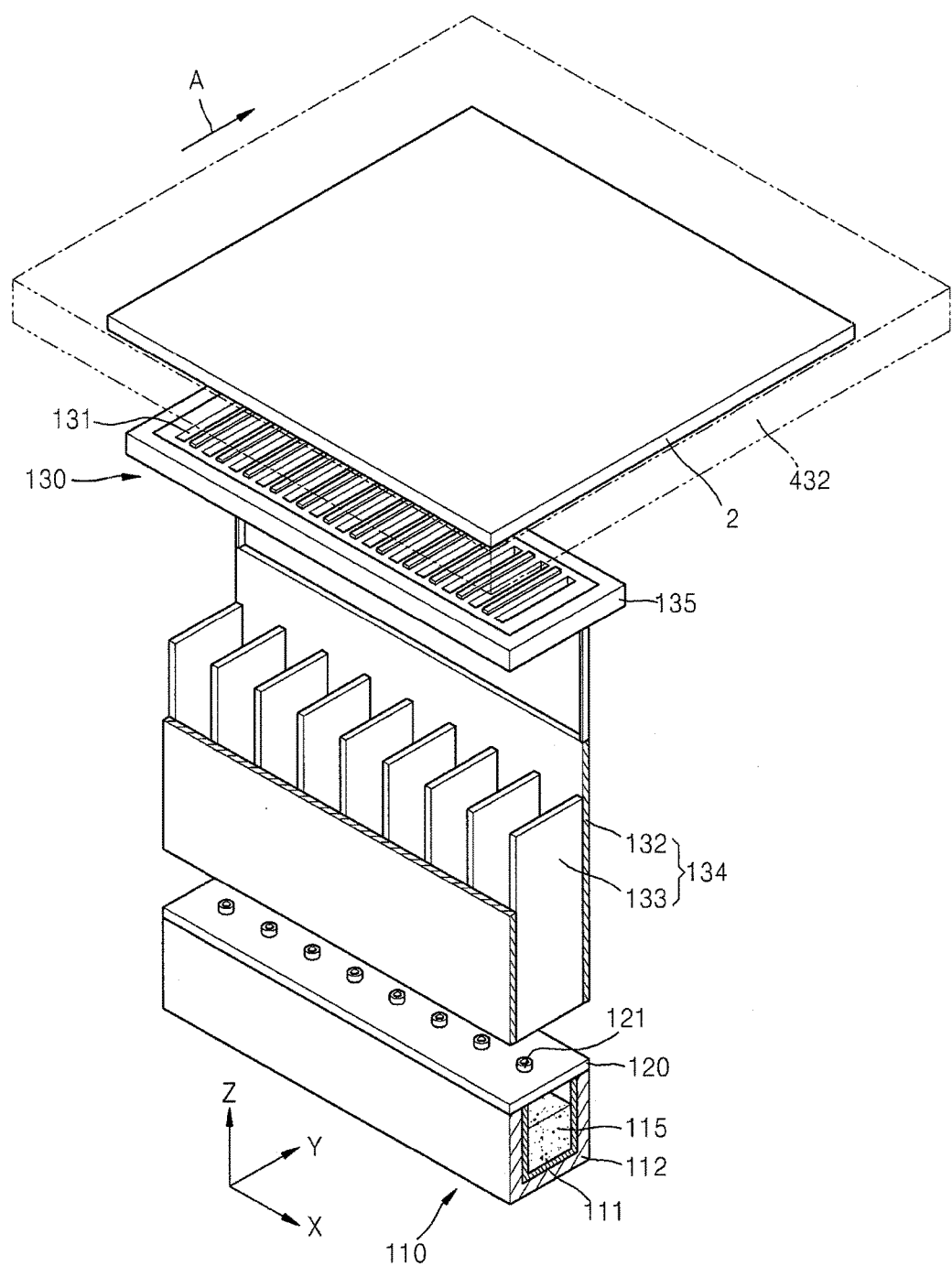
FIG. 13 is a perspective view of a deposition assembly according to another embodiment of the present invention.
Figure 14:
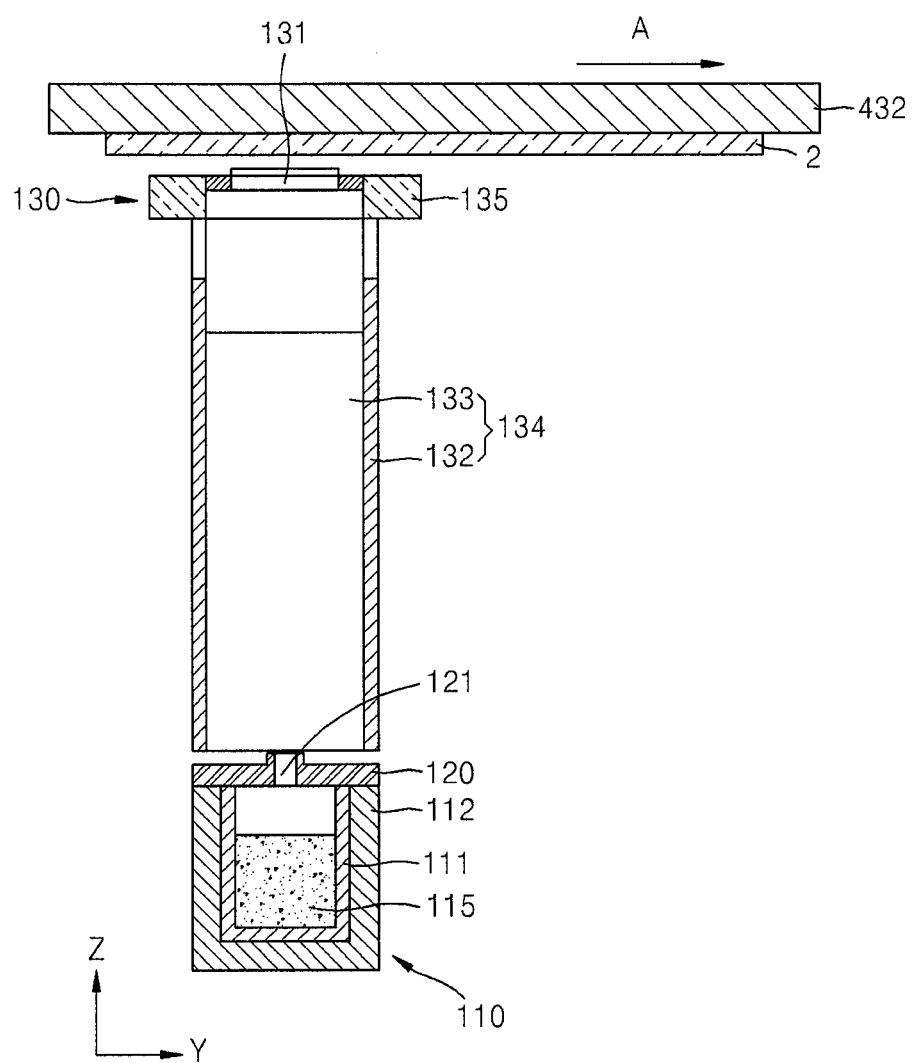
FIG. 14 is a side cross-sectional view of the deposition assembly of FIG. 13.
Figure 15:
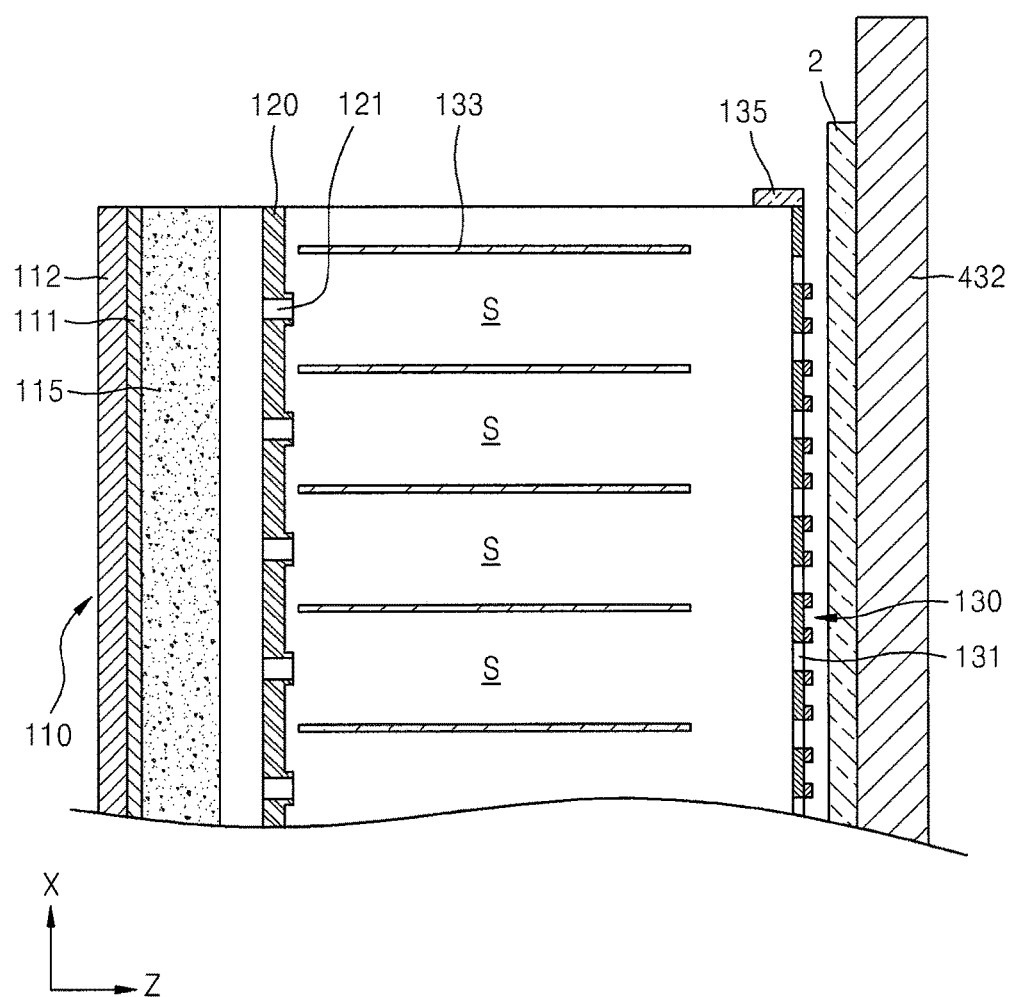
FIG. 15 is a schematic plan cross-sectional view of the deposition assembly of FIG. 13.

FIG. 13 is a perspective view of a deposition assembly according to another embodiment of the present invention. FIG. 14 is a side cross-sectional view of the deposition assembly of FIG. 13. FIG. 15 is a schematic plan cross-sectional view of the deposition assembly of FIG. 13.

Referring to FIGS. 13 through 15, the deposition assembly according to the present embodiment includes the deposition source 110, the deposition source nozzle unit 120, a shield plate assembly 134, and the patterning slit sheet 130.

In this regard, the deposition source 110 includes the crucible 111 filled with the deposition material 115 therein, and the heater 112 that heats the crucible 111 to evaporate (vaporize) the deposition material 115 filled in the crucible 111 toward the deposition source nozzle unit 120. The deposition source nozzle unit 120 is disposed at a side of the deposition source 110 and the plurality of deposition nozzles 121 are formed in an X-axis direction in the deposition source nozzle unit 120.

The shield plate assembly 134 is disposed at a side of the deposition source nozzle unit 120. The shield plate assembly 134 includes a plurality of shielding plates 133 and a shielding plate frame 132 disposed outside the shielding plates 133. The shielding plates 133 may be arranged adjacent to each other in the X-axis direction. In this regard, the shielding plates 133 may be formed at equal intervals. In addition, each of the shielding plates 133 may extend along a YZ plane of FIG. 13 and may have a rectangular shape. As such, the shielding plates 133 divide a space between the deposition source nozzle unit 120 and the patterning slit sheet 130 into a plurality of deposition spaces S. That is, in the deposition assembly according to the present embodiment, as shown in FIG. 15, the shielding plates 133 define the deposition spaces S for the respective deposition nozzles 121 for spraying deposition materials. As such, since the shielding plates 133 divide the space between the deposition source nozzle unit 120 and the patterning slit sheet 130 into the deposition spaces S, a deposition material discharged from a deposition nozzle 121 may not be mixed with deposition materials discharged from other deposition nozzles 121, may be passed through the patterning slits 131, and may be deposited on the substrate 2. That is, the shielding plates 133 guide deposition materials discharged from the deposition nozzles 121 to move in a straight direction parallel to a Z-axis direction without being dispersed.

As such, since the deposition materials may have straight properties due to the shielding plates 133, an area of shadow formed on the substrate 2 may be remarkably reduced, and thus, the deposition assembly and the substrate 2 may be spaced apart from each other at equal intervals.

The patterning slit sheet 130 is further disposed between the deposition source 110 and the substrate 2. The patterning slit sheet 130 has been described already, and thus, a detailed description thereof is omitted herein.

Figure 16:
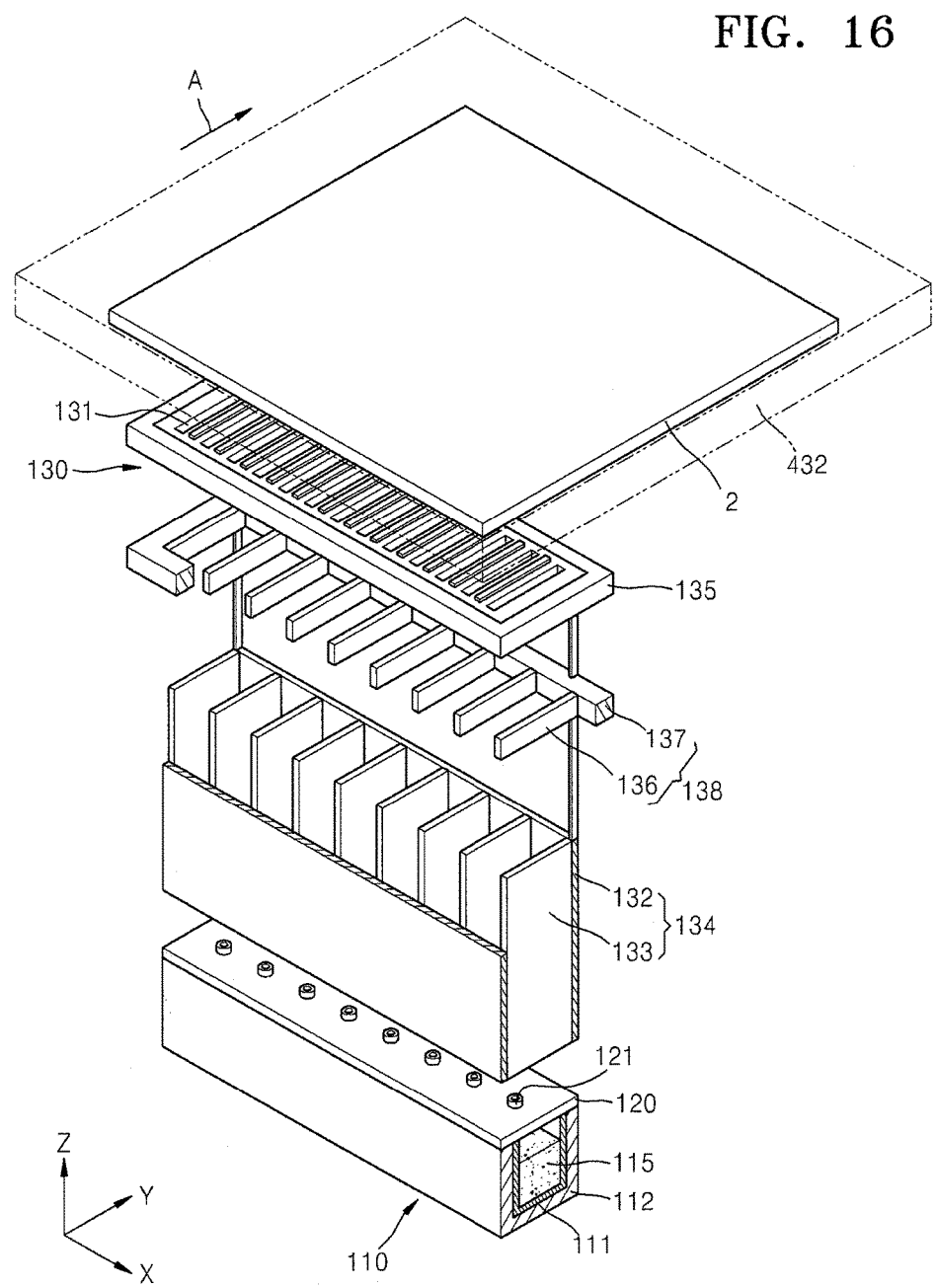
FIG. 16 is a perspective view of a deposition assembly according to another embodiment of the present invention.

FIG. 16 is a perspective view of a deposition assembly according to another embodiment of the present invention.

The deposition assembly shown in FIG. 16 includes the deposition source 110, the deposition source nozzle unit 120, a first shield plate assembly 134, a second shielding plate assembly 138, and the patterning slit sheet 130. In this regard, the deposition source 110, the deposition source nozzle unit 120, the first shield plate assembly 134, and the patterning slit sheet 130 are the same as in FIG. 13, and thus, a detailed description thereof is omitted therein. The present embodiment is different from the above-described embodiment in that the second shielding plate assembly 138 is disposed at a side of the first shield plate assembly 134.

In more detail, the second shielding plate assembly 138 includes a plurality of second shielding plates 136 and a second shielding plate frame 137 disposed outside the second shielding plates 136. The second shielding plates 136 may be arranged adjacent to each other in an X-axis direction. In addition, the second shielding plates 136 may be spaced apart from each other at equal intervals. Each of the second shielding plates 136 is formed in parallel to a YZ plane of FIG. 16, that is, in a perpendicular direction to the X-axis direction.

The first shielding plates 133 and the second shielding plates 136 define the space between the deposition source nozzle unit 120 and the patterning slit sheet 130. That is, the first shielding plates 133 and the second shielding plates 136 define deposition spaces for the respective deposition nozzles 121 for spraying deposition materials.

In this regard, the second shielding plates 136 may be arranged to have one-to-one correspondence with the first shielding plates 133. In other words, the second shielding plates 136 may be aligned with the first shielding plates 133 in parallel to each other. That is, the first shielding plates 133 and the second shielding plates 136, which correspond to each other, may be disposed on the same plane. FIG. 16 shows a case where the length of each of the first shielding plates 133 is equal to the width of each of the second shielding plates 136, which is measured in the X-axis direction. However, the present invention is not limited thereto. That is, the second shielding plates 136 that are required to be precisely aligned with the patterning slits 131 may be relatively thin and the first shielding plates 133 that are not required to be precisely aligned with the patterning slits 131 may be relatively thick, and thus, the first shielding plates 133 and the second shielding plates 136 may be easily manufactured.

Figure 17:
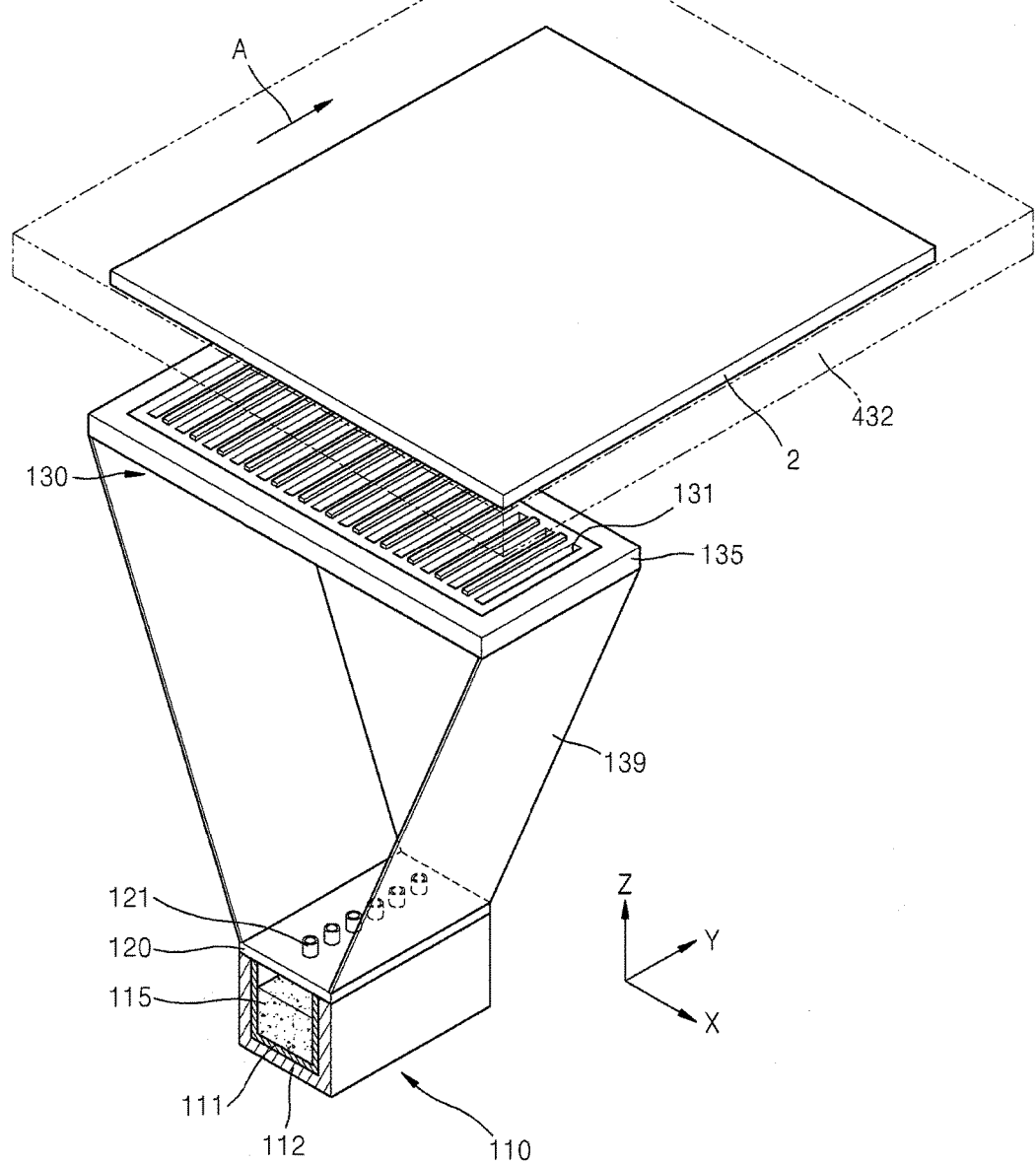
FIG. 17 is a perspective view of a deposition assembly according to another embodiment of the present invention.

FIG. 17 is a perspective view of a deposition assembly according to another embodiment of the present invention.

Referring to FIG. 17, the deposition assembly according to the present embodiment includes the deposition source 110, the deposition source nozzle unit 120, and the patterning slit sheet 130. In this regard, the deposition source 110, the deposition source nozzle unit 120, and the patterning slit sheet 130 are the same as in FIG. 13, and thus, a detailed description thereof is omitted herein. According to the present embodiment, the deposition source 110 and the deposition source nozzle unit 120 may be combined with the patterning slit sheet 130 by a connection member 139.

Figure 18:
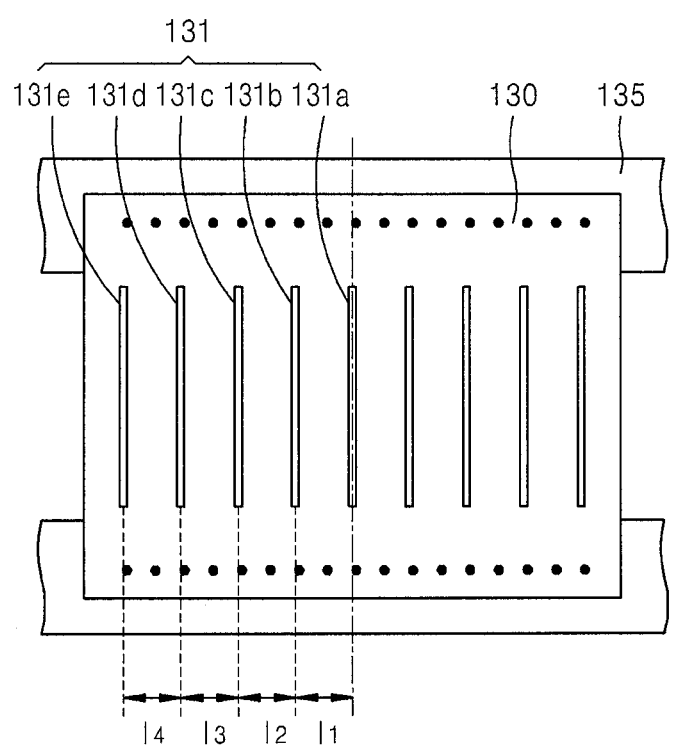
FIG. 18 is a diagram illustrating a structure in which patterning slits are arranged at equal intervals in a patterning slit sheet of a deposition apparatus, according to an embodiment of the present invention.
Figure 19:
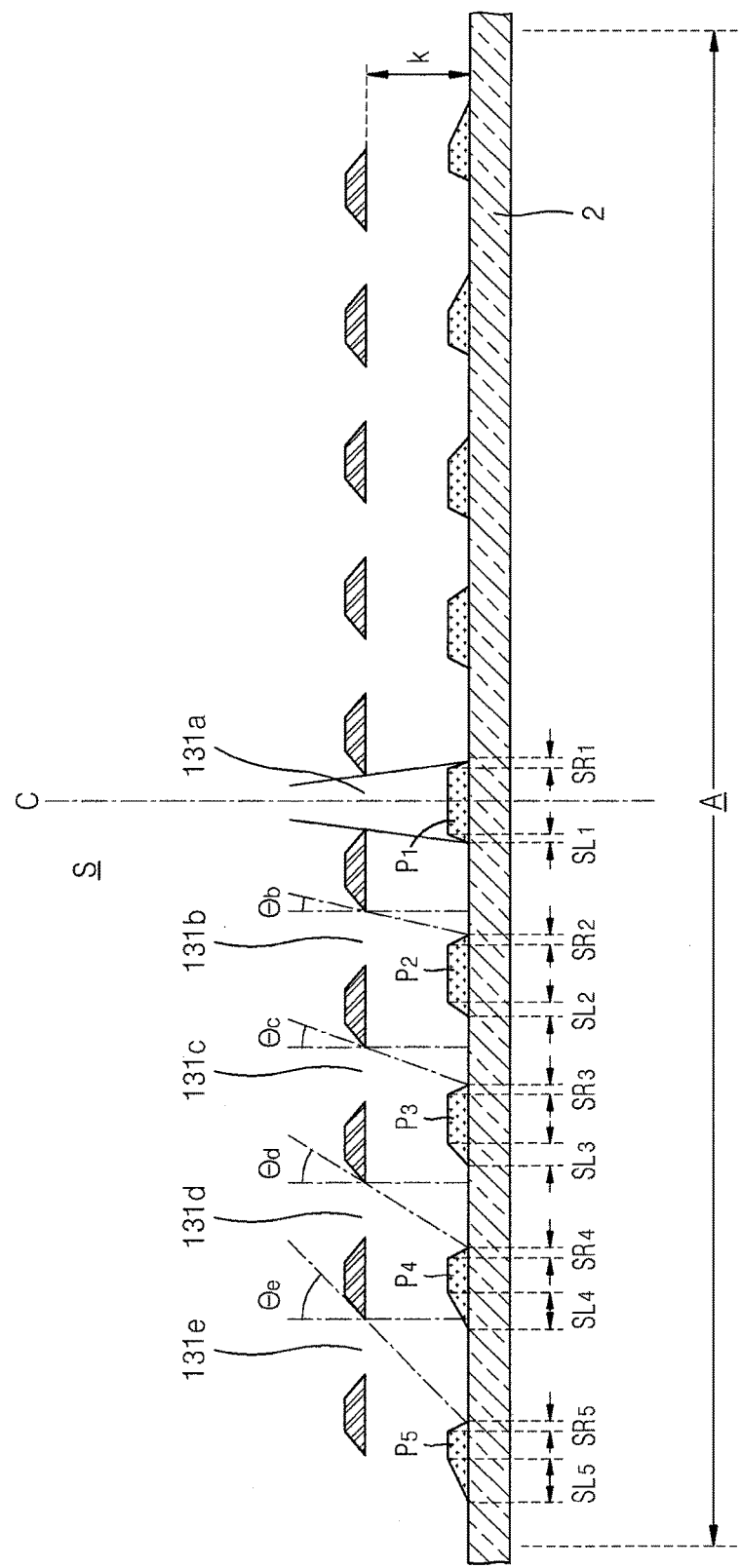
FIG. 19 is a diagram illustrating organic layers formed on a substrate by using the patterning slit sheet of FIG. 18, according to an embodiment of the present invention.

FIG. 18 is a diagram illustrating a structure in which the patterning slits 131 are arranged at equal intervals in the patterning slit sheet 130 of the deposition apparatus 1, according to an embodiment of the present invention. FIG. 19 is a diagram illustrating organic layers formed on the substrate 2 by using the patterning slit sheet 130 of FIG. 18, according to an embodiment of the present invention.

FIGS. 18 and 19 illustrate the patterning slit sheet 130 in which the patterning slits 131 are arranged at equal intervals. That is, in FIG. 18, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a shadow having a minimum size, and a right-side shadow $SR_1$ and a left-side shadow $SL_1$ are formed symmetrical to each other.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SL_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 19, the organic layers formed on the left side of the center line C of the deposition space S have a structure in which a left slanted side (left hypotenuse) is larger than a right slanted side (right hypotenuse), and the organic layers formed on the right side of the center line C of the deposition space S have a structure in which a right slanted side (right hypotenuse) is larger than a left slanted side (left hypotenuse).

In addition, in the organic layers formed on the left side of the center line C of the deposition space S, the length of the left slanted side increases towards the left. In the organic layers formed on the right side of the center line C of the deposition space S, the length of the right slanted side increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $θ_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $θ_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $θ_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $θ_e$, and an organic layer $P_5$ formed using the deposition material that has passed through the patterning slit 131e has a left-side shadow having a size of $SL_5$.

In this regard, the critical incident angles satisfy the following condition: $θ_b<θ_c<θ_d<θ_e$, and thus, the sizes of the shadows of the organic layers also satisfy the following condition: $SL_1<SL_2<SL_3<SL_4<SL_5$.

These patterns of the organic layers may also be formed on the first lines 271 to the fourth lines 274 in FIGS. 1 to 3.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
   a substrate comprising a plurality of pixels, each of which comprises a first sub-pixel, a second sub-pixel, and a third sub-pixel, and a plurality of pixel electrodes independently formed for respective sub-pixels;
   a first common layer commonly formed on the plurality of pixels;
   a plurality of first lines, each extending continuously in a first direction and having a first width in a second direction perpendicular to the first direction, and each covering a plurality of the first sub-pixels arranged in the first direction, wherein the plurality of first lines comprise a first organic light-emitting layer;
   a plurality of second lines, each extending continuously in the first direction and having a second width in the second direction, and each covering a plurality of the second sub-pixels arranged in the first direction, wherein the plurality of second lines comprise a second organic light-emitting layer that is different from the first organic light-emitting layer;
   a plurality of third lines comprising a hole injection material, or a hole transport material, or a hole injection material and a hole transport material, each extending continuously in the first direction and having a third width in the second direction and each covering the plurality of the first sub-pixels and the plurality of the second sub-pixels and not covering any third sub-pixel of the plurality of pixels, the plurality of the first sub-pixels and the plurality of the second sub-pixels being adjacent to each other in the second direction, wherein the third width is larger than a sum of the first and second widths;
a second common layer commonly formed on the plurality of pixels, wherein the second common layer comprises a third organic light-emitting layer that is different from the first organic light-emitting layer and the second organic light-emitting layer;
a third common layer commonly formed on the plurality of pixels; and
an opposite electrode commonly formed on the plurality of pixels,
wherein the first common layer, the second common layer, and the third common layer are formed continuously on the first sub-pixel, the second sub-pixel, and the third sub-pixel in each pixel.

2. The organic light-emitting display apparatus of claim 1, wherein the first common layer comprises:
a hole injection material, or
a hole transport material, or
a hole injection material and a hole transport material.

3. The organic light-emitting display apparatus of claim 1, wherein the third common layer comprises an electron transport material.

4. The organic light-emitting display apparatus of claim 1, further comprising a plurality of fourth lines each extending continuously in the first direction and each covering any one of the plurality of the first sub-pixels arranged in the first direction, the plurality of the second sub-pixels arranged in the first direction, and a plurality of the third sub-pixels arranged in the first direction.

5. The organic light-emitting display apparatus of claim 4, wherein the plurality of fourth lines comprise:
a hole injection material, or
a hole transport material, or
a hole injection material and a hole transport material.

6. The organic light-emitting display apparatus of claim 1, wherein the plurality of pixel electrodes comprise light-transmitting conductive oxide having a greater refractive index than the substrate,
the organic light-emitting display apparatus further comprising:
a refraction conversion layer between the substrate and the plurality of pixel electrodes, the refraction conversion layer comprising a first layer having a refractive index greater than a refractive index of the plurality of pixel electrodes, a second layer having a refractive index smaller than the refractive index of the first layer, and a third layer having a refractive index smaller than the refractive index of the second layer, wherein the first layer, the second layer, and the third layer are sequentially stacked from the plurality of pixel electrodes toward the substrate.

7. The organic light-emitting display apparatus of claim 1, wherein each of the second lines of the plurality of second lines does not overlap, in a direction perpendicular to a top surface of the substrate, any first line of the plurality of first lines.

8. An organic light-emitting display apparatus comprising:
a substrate comprising a plurality of pixels, each of which comprises a first sub-pixel, a second sub-pixel, and a third sub-pixel, and a plurality of pixel electrodes independently formed for respective sub-pixels, the plurality of pixel electrodes comprising light-transmitting conductive oxide and having a refractive index greater than a refractive index of the substrate;
a refraction conversion layer between the substrate and the plurality of pixel electrodes, the refraction conversion layer comprising a first layer having a refractive index greater than a refractive index of the plurality of pixel electrodes, a second layer having a refractive index smaller than the refractive index of the first layer, and a third layer having a refractive index smaller than the refractive index of the second layer, wherein a thickness of the first layer is smaller than a thickness of the second layer, and the thickness of the second layer is smaller than a thickness of the third layer, and wherein the first layer, the second layer, and the third layer are sequentially stacked from the plurality of pixel electrodes toward the substrate,
a first common layer commonly formed on the plurality of pixels;
a plurality of first lines, each extending continuously in a first direction and each covering a plurality of the first sub-pixels arranged in the first direction, wherein the plurality of first lines comprise a first organic light-emitting layer;
a plurality of second lines, each extending in the first direction and each covering a plurality of the second sub-pixels arranged in the first direction, wherein the plurality of second lines comprise a second organic light-emitting layer that is different from the first organic light-emitting layer;
a plurality of third lines comprising a hole injection material, or a hole transport material, or a hole injection material and a hole transport material, each extending continuously in the first direction and each covering the plurality of the first sub-pixels and the plurality of the second sub-pixels and not covering any third sub-pixel of the plurality of pixels, the plurality of the first sub-pixels and the plurality of the second sub-pixels being adjacent to each other in a second direction,
a second common layer commonly formed on the plurality of pixels, wherein the second common layer comprises a third organic light-emitting layer that is different from the first organic light-emitting layer and the second organic light-emitting layer;
a third common layer commonly formed on the plurality of pixels; and
an opposite electrode commonly formed on the plurality of pixels,
wherein the first common layer, the second common layer, and the third common layer are formed continuously on the first sub-pixel, the second sub-pixel, and the third sub-pixel in each pixel.

9. The organic light-emitting display apparatus of claim 8, wherein a light transmittance of the first layer is smaller than a light transmittance of the second layer, and
wherein the light transmittance of the second layer is smaller than a light transmittance of the third layer.

10. The organic light-emitting display apparatus of claim 8, wherein the refractive index of the plurality of pixel electrodes is greater than a refractive index of at least one selected from the group consisting of the first common layer, the plurality of first lines, the plurality of second lines, the second common layer, and the third common layer.

11. The organic light-emitting display apparatus of claim 8, further comprising a semi-transparent reflective layer between the plurality of pixel electrodes and the refraction conversion layer.

12. A method of manufacturing an organic light-emitting display apparatus, the method comprising:

preparing a substrate comprising a plurality of pixels that each comprise a first sub-pixel, a second sub-pixel, and a third sub-pixel, and a plurality of pixel electrodes that are independently formed for respective sub-pixels;

commonly forming a first common layer on the plurality of pixels, when a first common-type deposition assembly and the substrate are spaced apart from each other and are moved relative to each other;

forming a plurality of first lines comprising a first organic light-emitting layer, when a first linear-layer deposition assembly and the substrate are spaced apart from each other and are moved relative to each other;

forming a plurality of second lines comprising a second organic light-emitting layer that is different from the first organic light-emitting layer, when a second linear-layer deposition assembly and the substrate are spaced apart from each other and are moved relative to each other;

forming a plurality of third lines comprising a hole injection material, or a hole transport material, or a hole injection material and a hole transport material, when a third linear-layer deposition assembly and the substrate are spaced apart from each other and are moved relative to each other;

commonly forming a second common layer comprising a third organic light-emitting layer that is different from the first and second organic light-emitting layers, when a second common-type deposition assembly and the substrate are spaced apart from each other and are moved relative to each other;

commonly forming a third common layer on the plurality of pixels, when a third common-type deposition assembly and the substrate are spaced apart from each other and are moved relative to each other; and commonly forming an opposite electrode on the plurality of pixels, wherein the organic light emitting display apparatus comprises:

the first common layer commonly formed on the plurality of pixels;

the plurality of first lines, each extending continuously in a first direction and having a first width in a second direction perpendicular to the first direction, and each covering a plurality of the first sub-pixels arranged in the first direction;

the plurality of second lines, each extending continuously in the first direction and having a second width in the second direction, and each covering a plurality of the second sub-pixels arranged in the first direction;

the plurality of third lines, each extending continuously in the first direction and having a third width in the second direction and each covering the plurality of the first sub-pixels and the plurality of the second sub-pixels and not covering any third sub-pixel of the plurality of pixels, the plurality of the first sub-pixels and the plurality of the second sub-pixels being adjacent to each other in the second direction, wherein the third width is larger than a sum of the first and second widths;

the second common layer commonly formed on the plurality of pixels;

the third common layer commonly formed on the plurality of pixels;

the opposite electrode commonly formed on the plurality of pixels; and the first common layer, the second common layer, and the third common layer formed continuously on the first sub-pixel, the second sub-pixel, and the third sub-pixel in each pixel.

13. The method of claim 12, wherein the first common layer comprises a hole injection transport material, or a hole transport material, or a hole injection material and a hole transport material.

14. The method of claim 12, wherein the third common layer comprises an electron transport material.

15. The method of claim 12, further comprising, forming a plurality of fourth lines when a fourth linear-layer deposition assembly and the substrate are spaced apart from each other and are moved relative to each other; and wherein the organic light emitting display apparatus comprises the plurality of fourth lines, each extending continuously in the first direction and each covering any one of the plurality of the first sub-pixels arranged in the first direction, the plurality of the second sub-pixels arranged in the first direction, and a plurality of the third sub-pixels arranged in the first direction.

16. The method of claim 15, wherein the plurality of fourth lines comprise a hole injection transport material, or a hole transport material, or a hole injection material and a hole transport material.

\* \* \* \* \*